(12) United States Patent
Eckinger et al.

(10) Patent No.: US 9,714,988 B2
(45) Date of Patent: Jul. 25, 2017

(54) HALL EFFECT SENSOR WITH GRAPHENE DETECTION LAYER

(71) Applicant: Infineon Technologies AG, Neubiberg (DE)

(72) Inventors: Markus Eckinger, Regenstauf (DE); Stefan Kolb, Unterschleissheim (DE); Alfons Dehe, Reutlingen (DE); Guenther Ruhl, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 202 days.

(21) Appl. No.: 14/514,415

(22) Filed: Oct. 15, 2014

(65) Prior Publication Data

US 2015/0102807 A1    Apr. 16, 2015

Related U.S. Application Data

(60) Provisional application No. 61/891,484, filed on Oct. 16, 2013.

(51) Int. Cl.
*G01R 33/06* (2006.01)
*G01R 33/07* (2006.01)
*H01L 27/092* (2006.01)
*G01R 33/00* (2006.01)
*H01L 43/14* (2006.01)
*H01L 43/06* (2006.01)

(52) U.S. Cl.
CPC ....... *G01R 33/072* (2013.01); *G01R 33/0052* (2013.01); *H01L 27/092* (2013.01); *H01L 43/065* (2013.01); *H01L 43/14* (2013.01)

(58) Field of Classification Search
CPC .... G01R 33/07; G01R 33/075; G01R 33/093; G01R 33/09
USPC .............. 324/251, 117, 127, 207.2, 252, 253
See application file for complete search history.

(56) References Cited

U.S. PATENT DOCUMENTS

| | | | | |
|---|---|---|---|---|
| 6,483,283 | B2 * | 11/2002 | Uayanagi | B81B 3/0005 324/71.5 |
| 6,869,878 | B1 * | 3/2005 | Adem | H01L 21/76807 257/E21.589 |
| 2004/0109938 | A1 * | 6/2004 | Liu | C23C 14/545 427/8 |
| 2009/0137066 | A1 | 5/2009 | Imai et al. | |
| 2009/0225592 | A1 * | 9/2009 | Lau | G11C 11/18 365/170 |
| 2011/0024862 | A1 * | 2/2011 | Tu | H01L 27/14618 257/434 |
| 2011/0037464 | A1 * | 2/2011 | Gurney | G01R 33/09 324/252 |

(Continued)

FOREIGN PATENT DOCUMENTS

| | | |
|---|---|---|
| CN | 102185099 A | 9/2011 |
| CN | 102206867 A | 10/2011 |

(Continued)

*Primary Examiner* — Tung X Nguyen
*Assistant Examiner* — Dominic Hawkins
(74) *Attorney, Agent, or Firm* — Viering, Jentschura & Partner mbB

(57) ABSTRACT

A Hall Effect sensor with a graphene detection layer implemented in a variety of geometries, including the possibility of a so-called "full 3-d" Hall sensor, with the option for integration in a BiCMOS process and a method for producing said Hall Effect sensor is disclosed.

24 Claims, 38 Drawing Sheets

(56) References Cited

U.S. PATENT DOCUMENTS

| | | | |
|---|---|---|---|
| 2012/0107562 A1* | 5/2012 | Bolotin | B81C 1/00595 |
| | | | 428/156 |
| 2012/0168723 A1* | 7/2012 | Park | H01L 21/0237 |
| | | | 257/29 |
| 2012/0241069 A1 | 9/2012 | Hofmann et al. | |
| 2013/0018599 A1 | 1/2013 | Peng | |
| 2013/0334579 A1* | 12/2013 | Accardi | G01N 27/414 |
| | | | 257/253 |
| 2014/0291819 A1* | 10/2014 | Barth | H01L 23/53276 |
| | | | 257/659 |
| 2014/0319357 A1* | 10/2014 | Ogawa | G01J 1/0429 |
| | | | 250/349 |
| 2014/0346579 A1 | 11/2014 | Franke | |
| 2016/0204204 A1* | 7/2016 | Franklin | H01L 29/778 |
| | | | 257/29 |

FOREIGN PATENT DOCUMENTS

| | | |
|---|---|---|
| CN | 103187283 A | 7/2013 |
| DE | 102013008794 A1 | 11/2014 |
| JP | 2004012156 A | 1/2004 |

\* cited by examiner

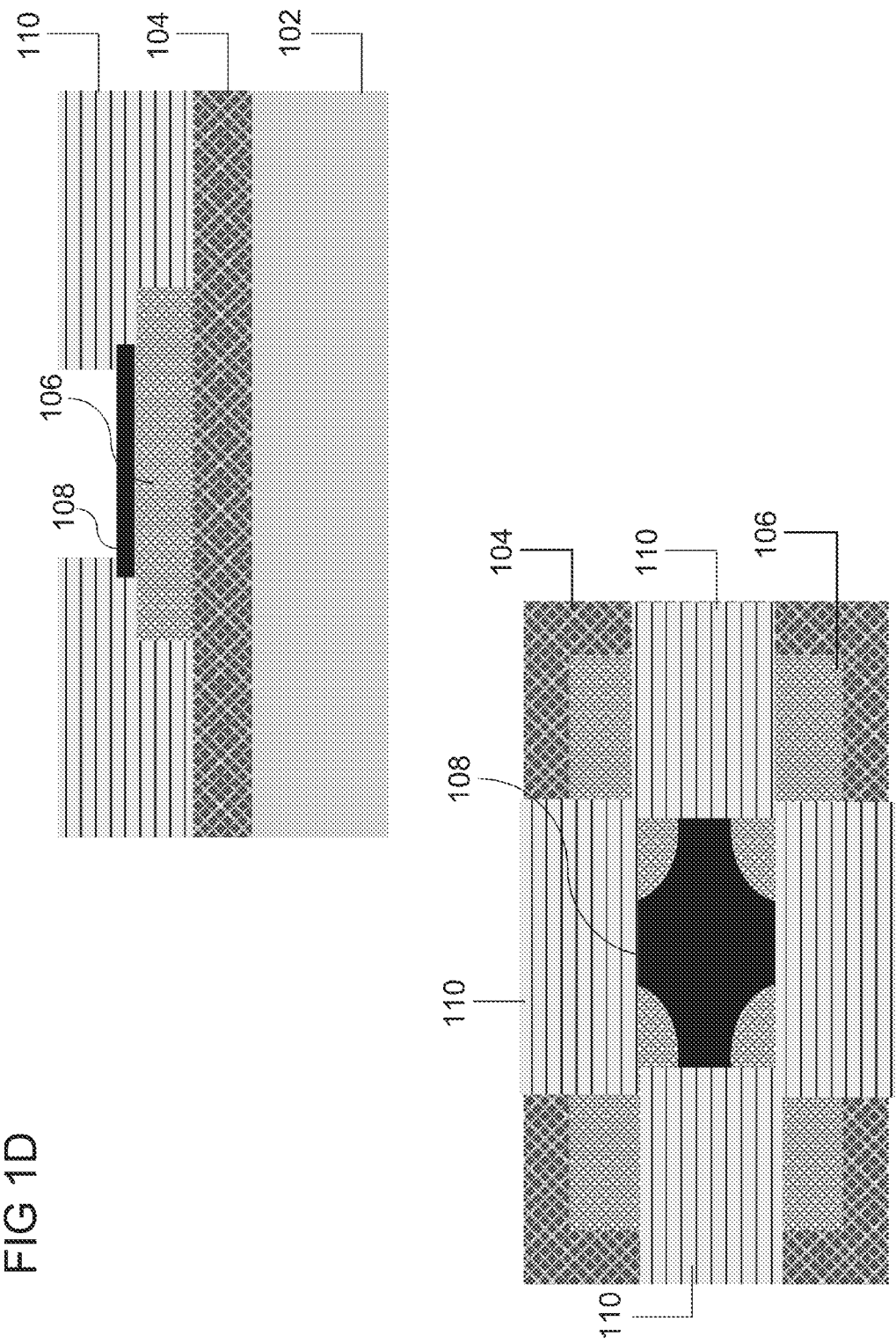

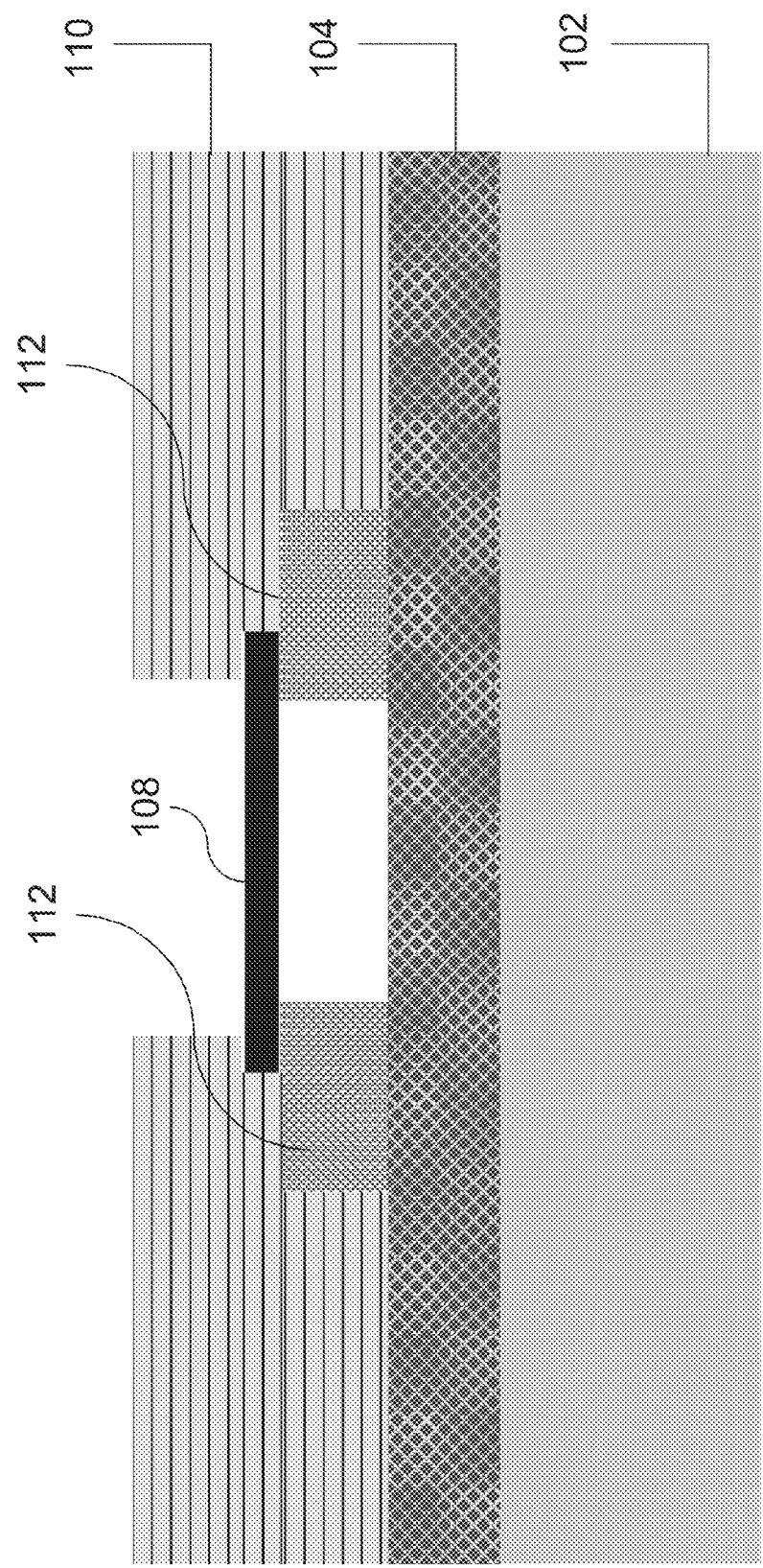

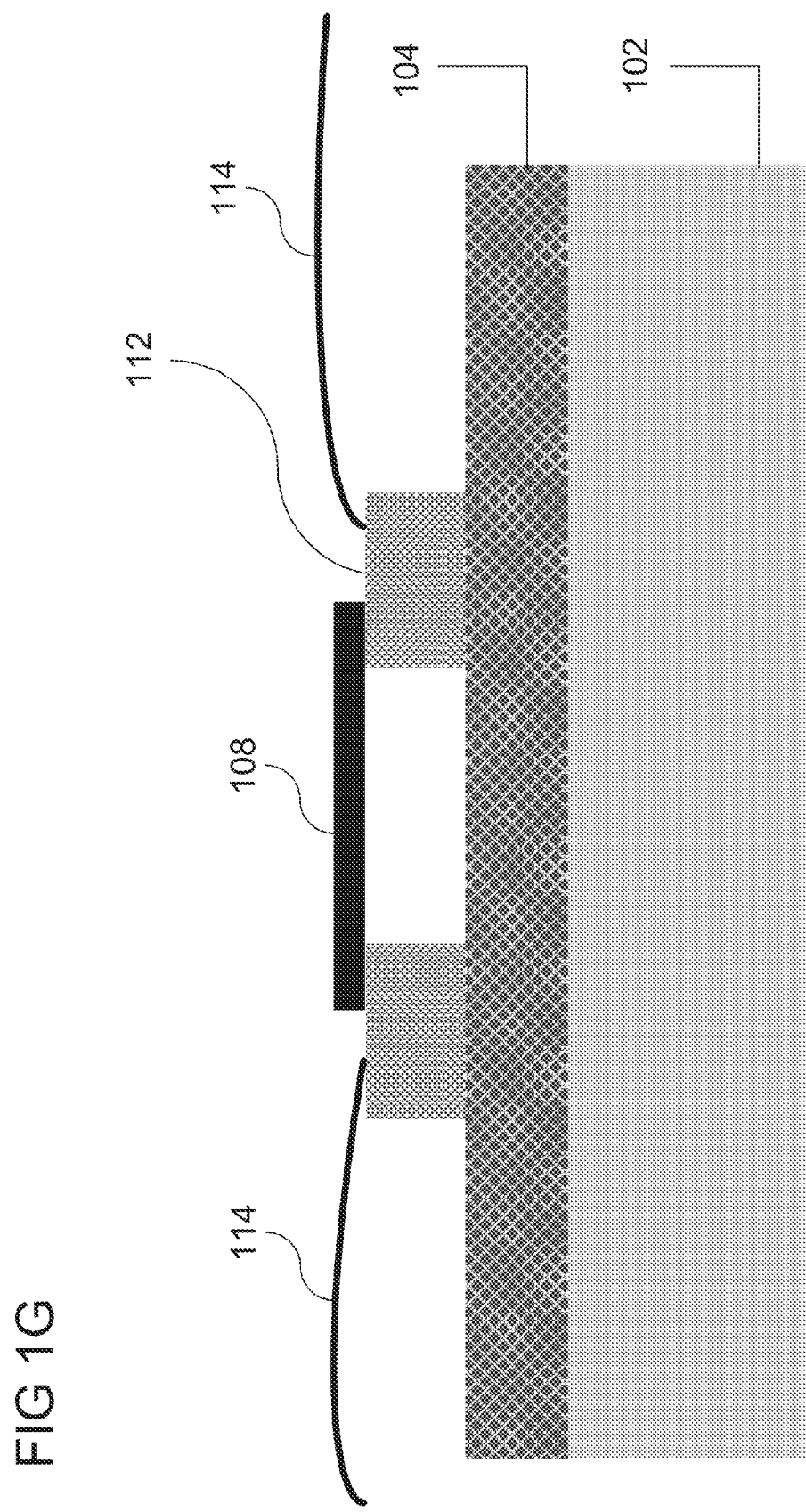

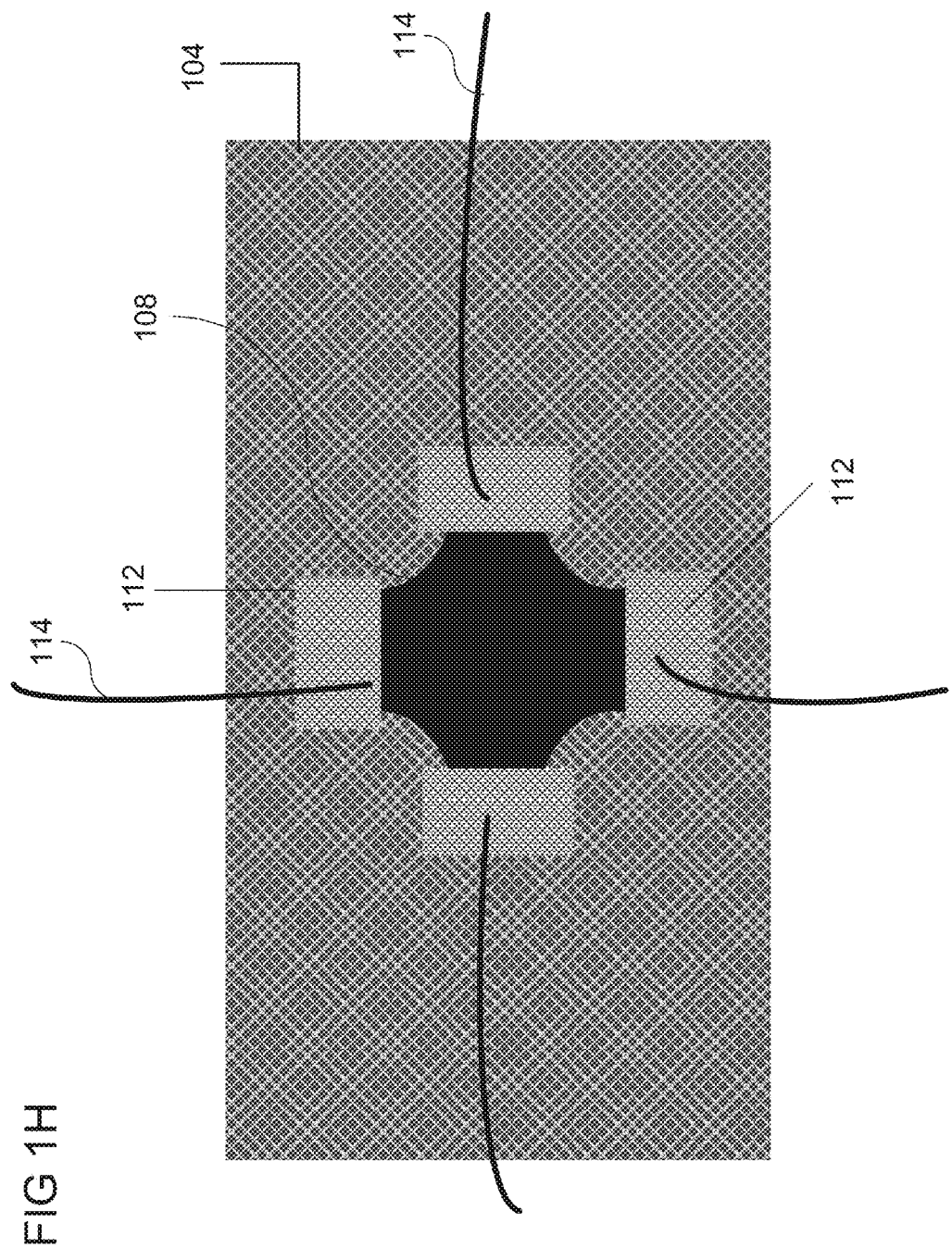

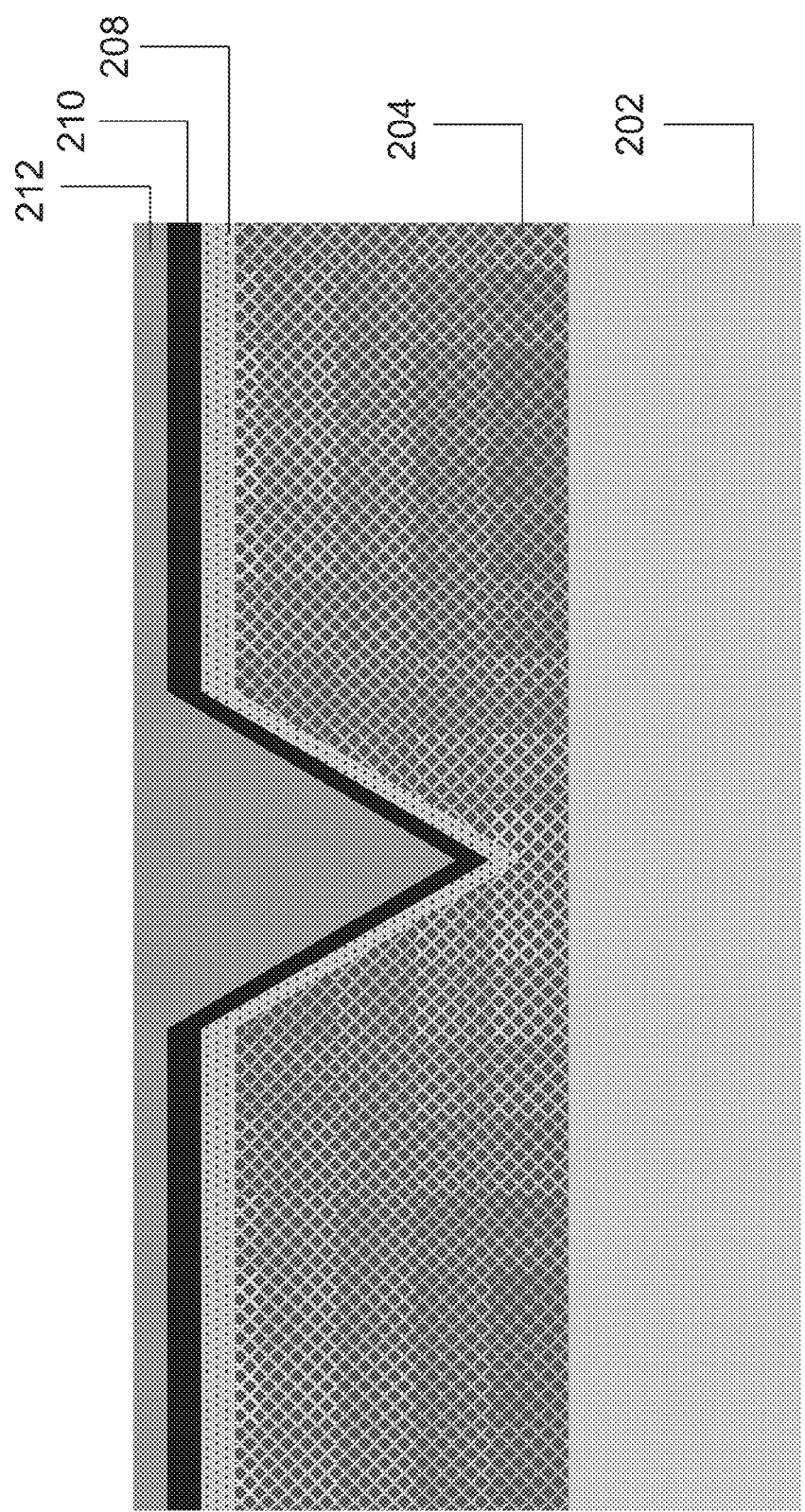

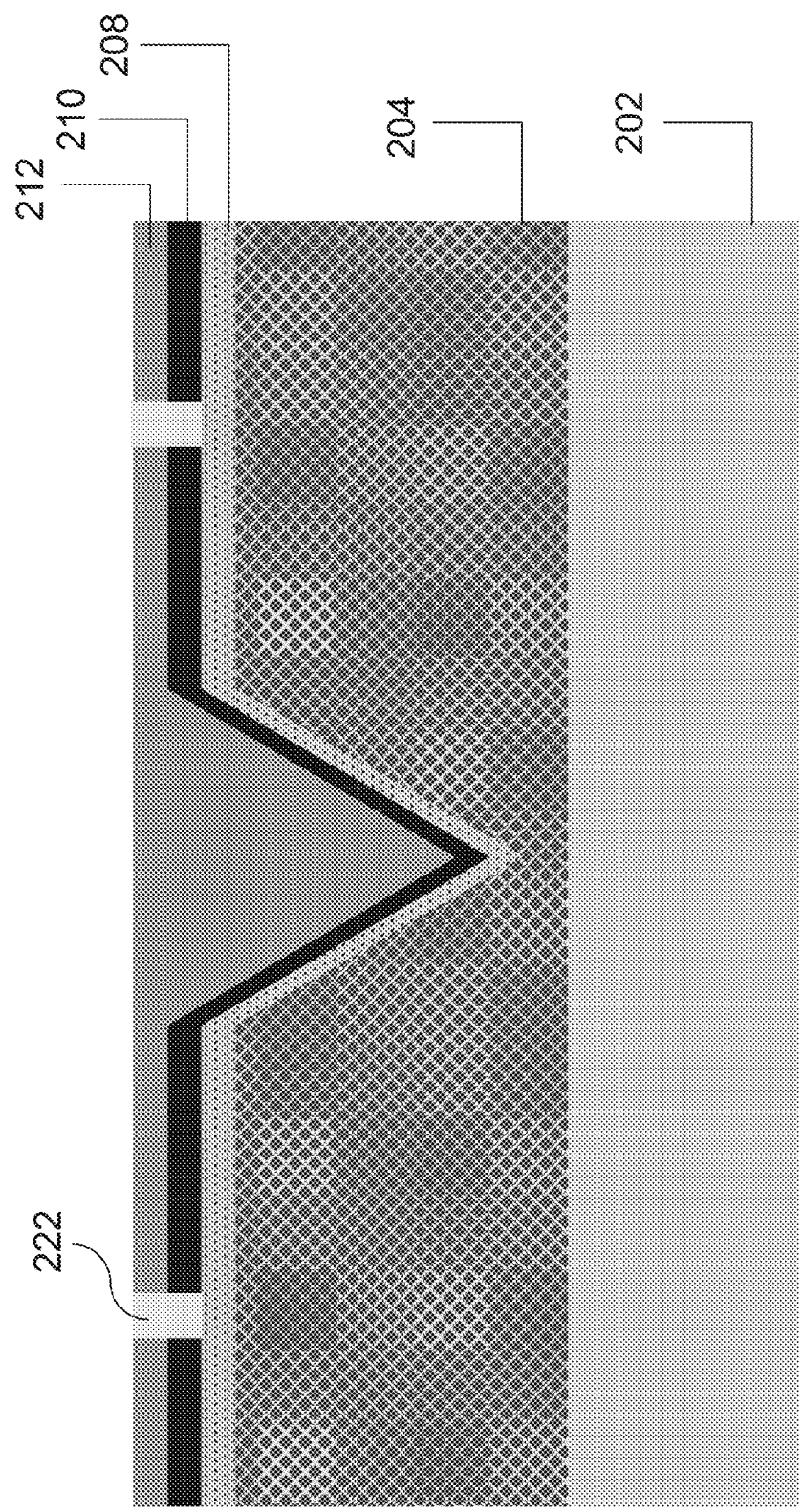

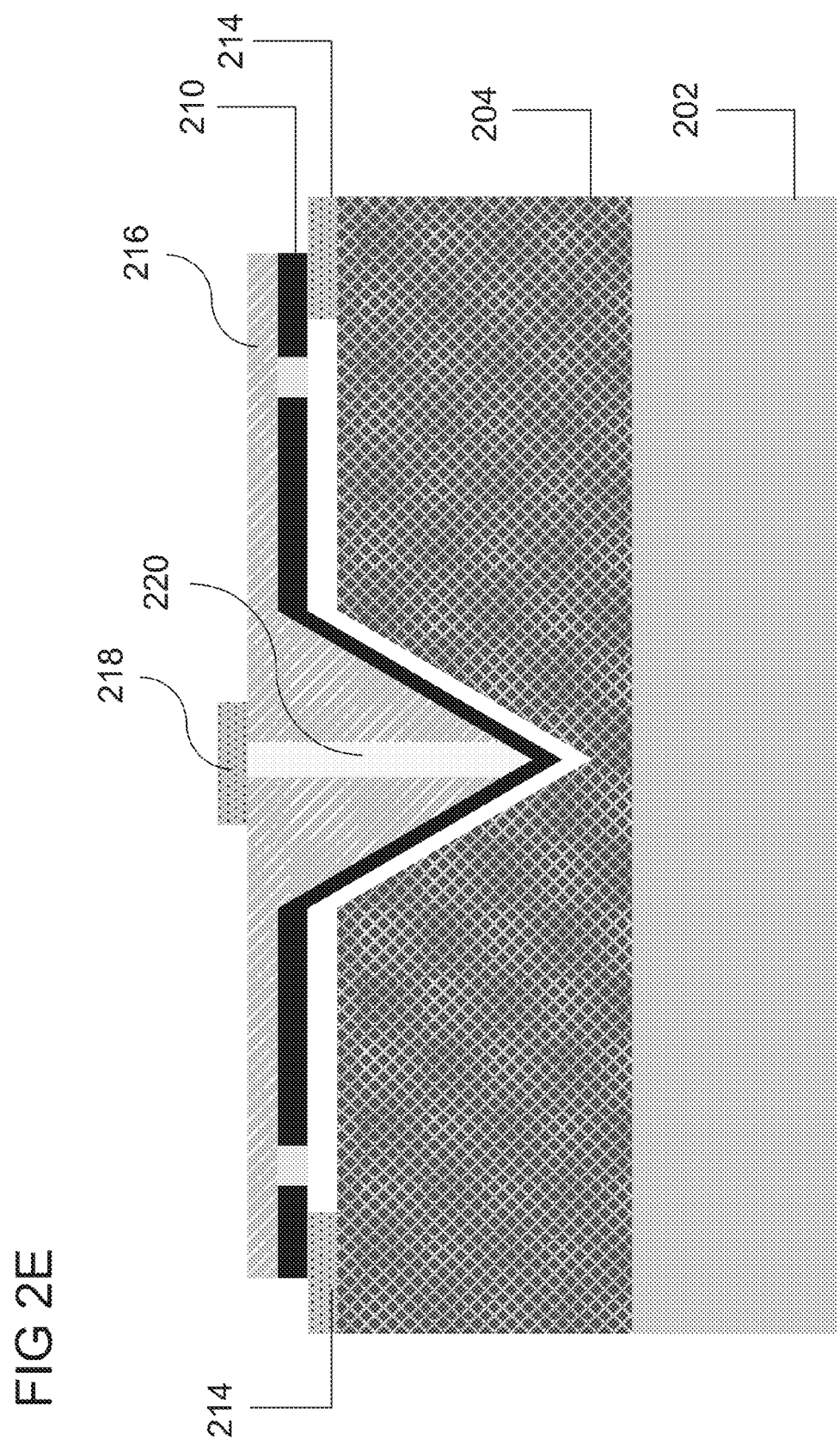

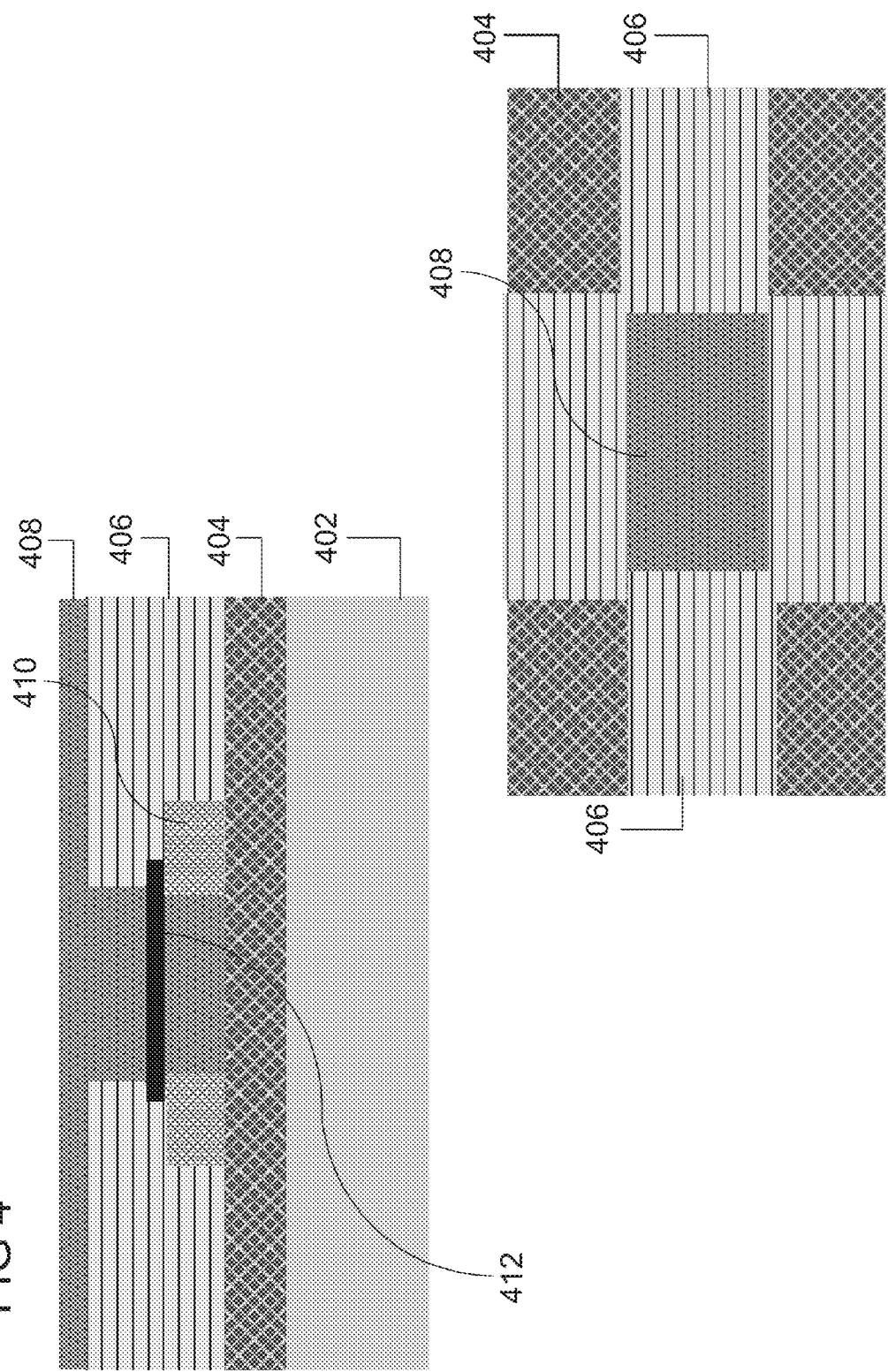

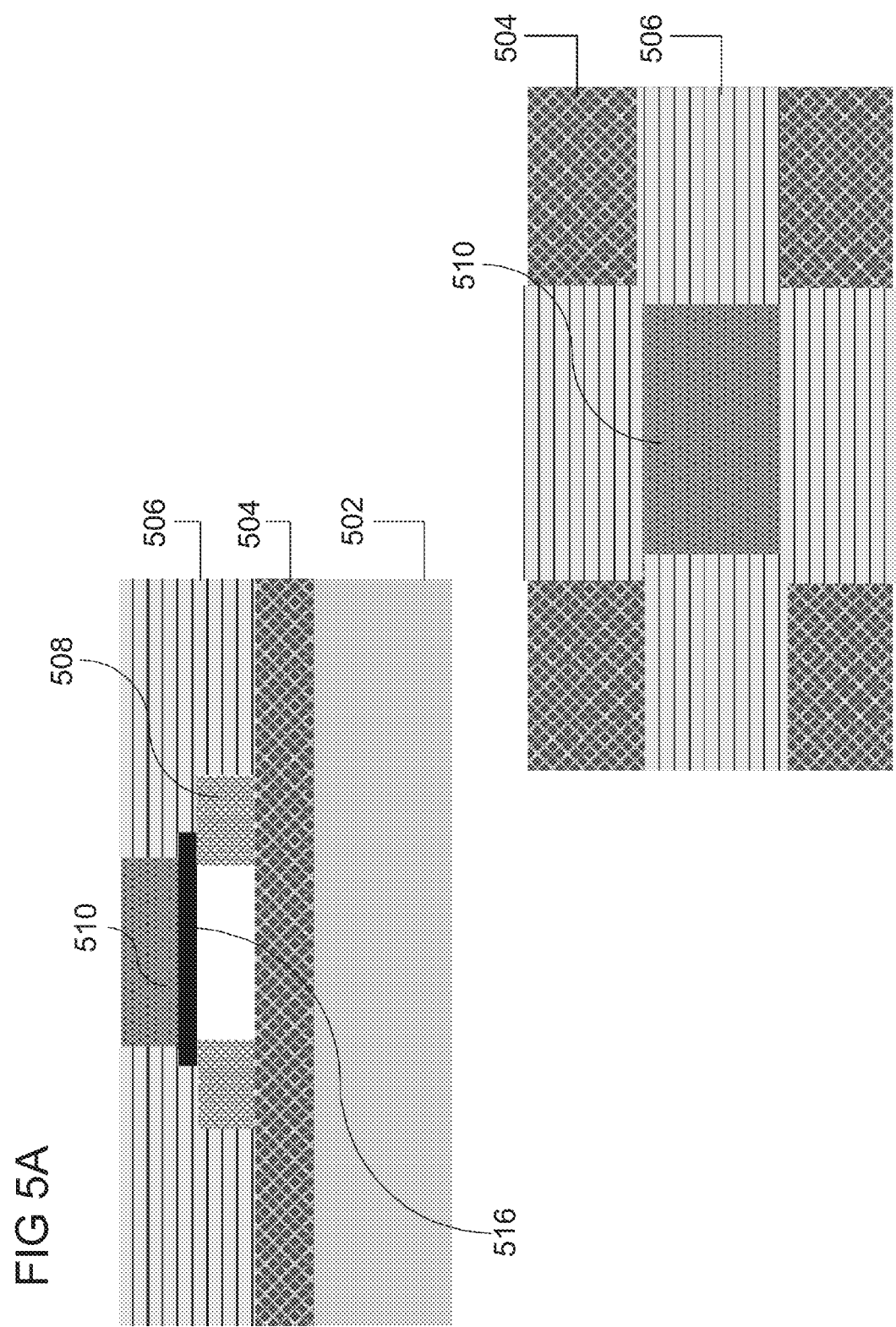

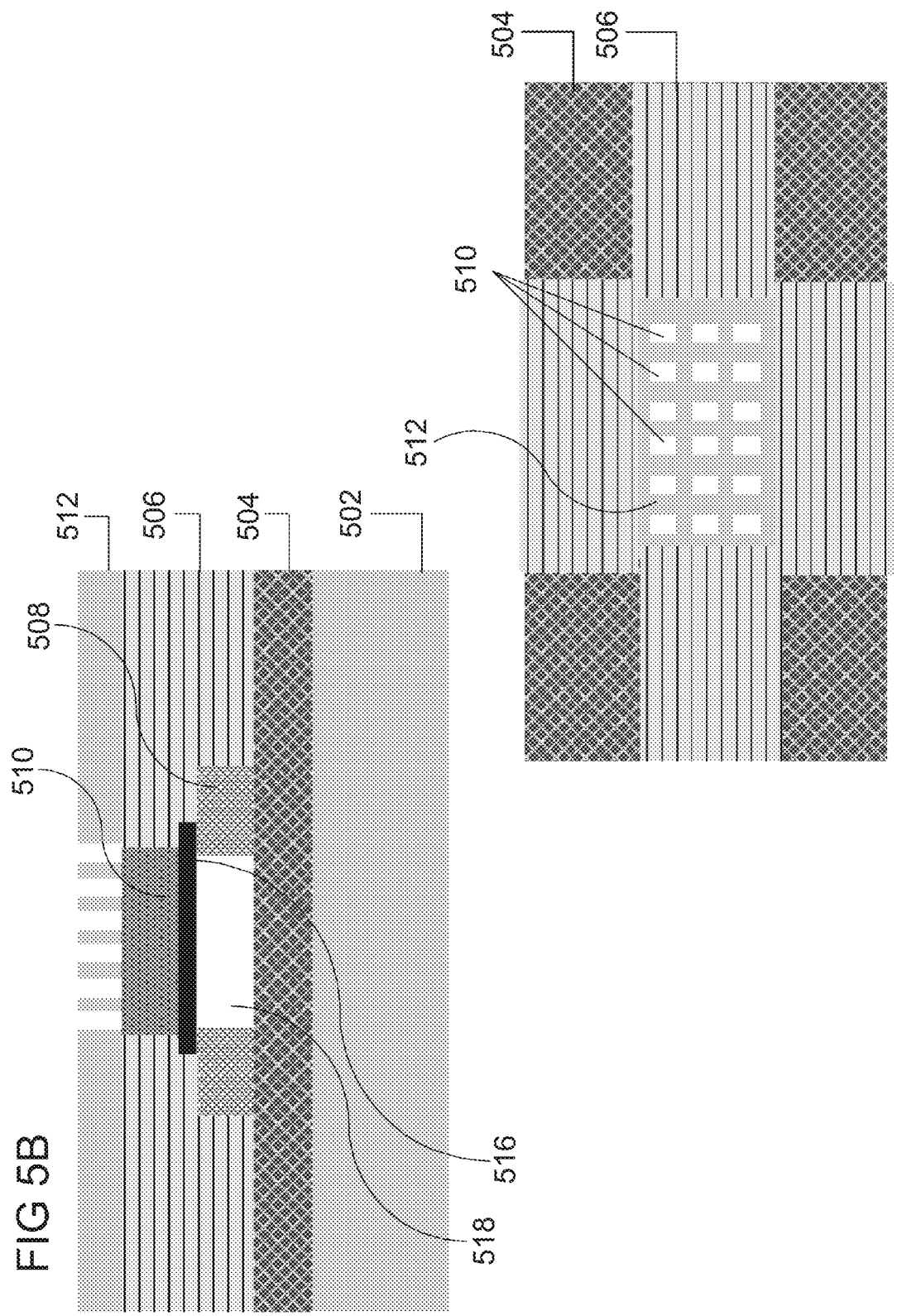

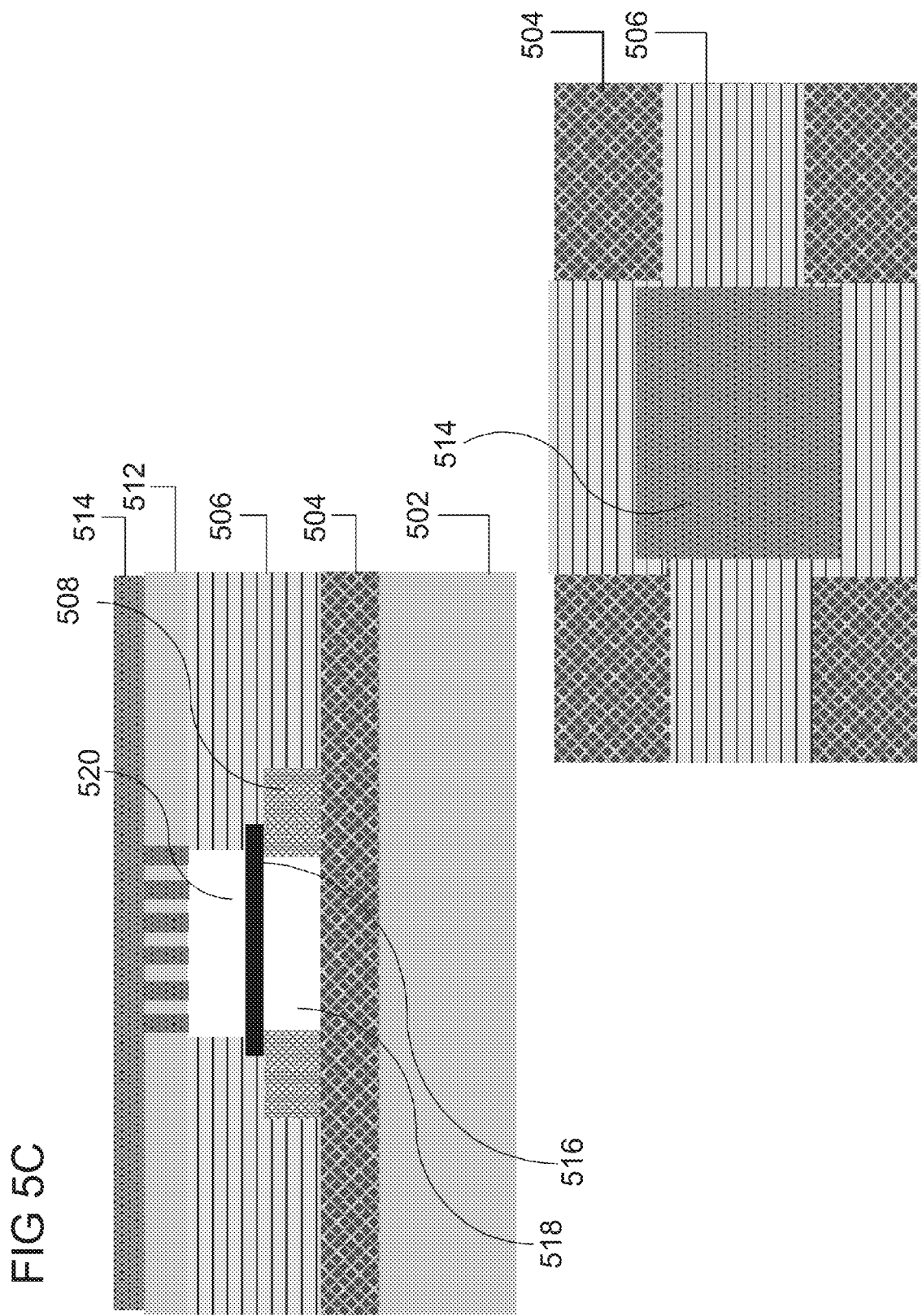

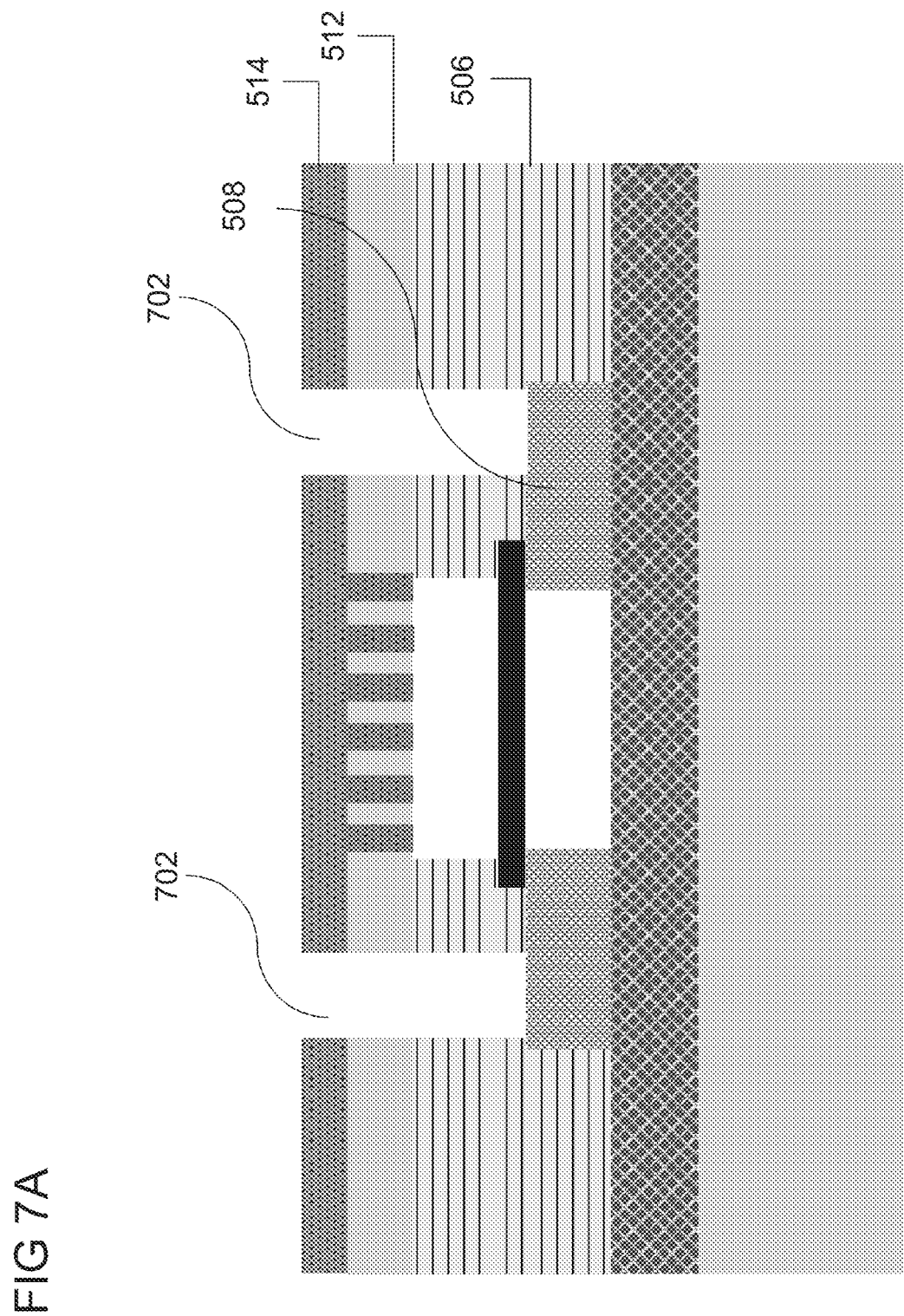

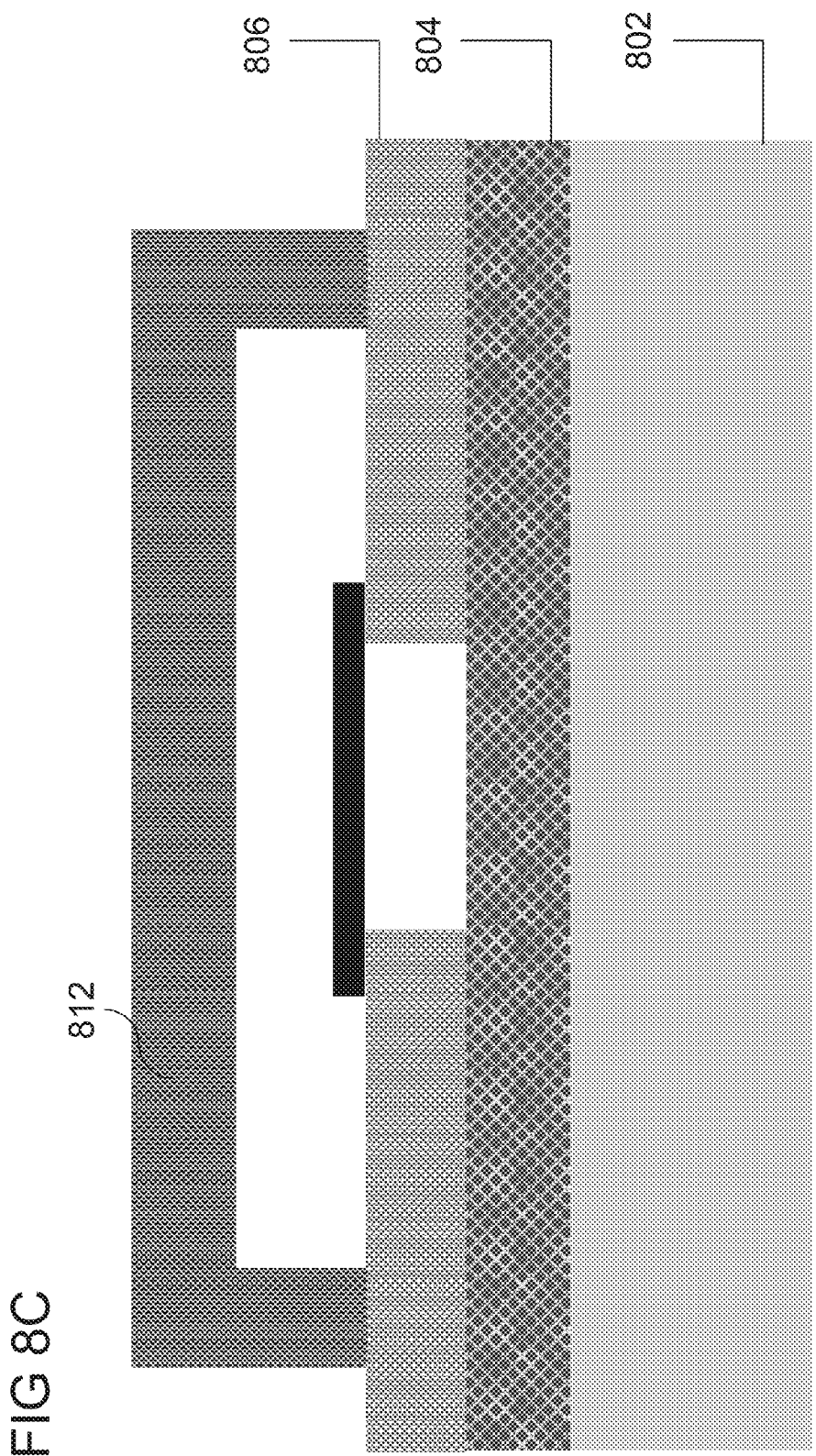

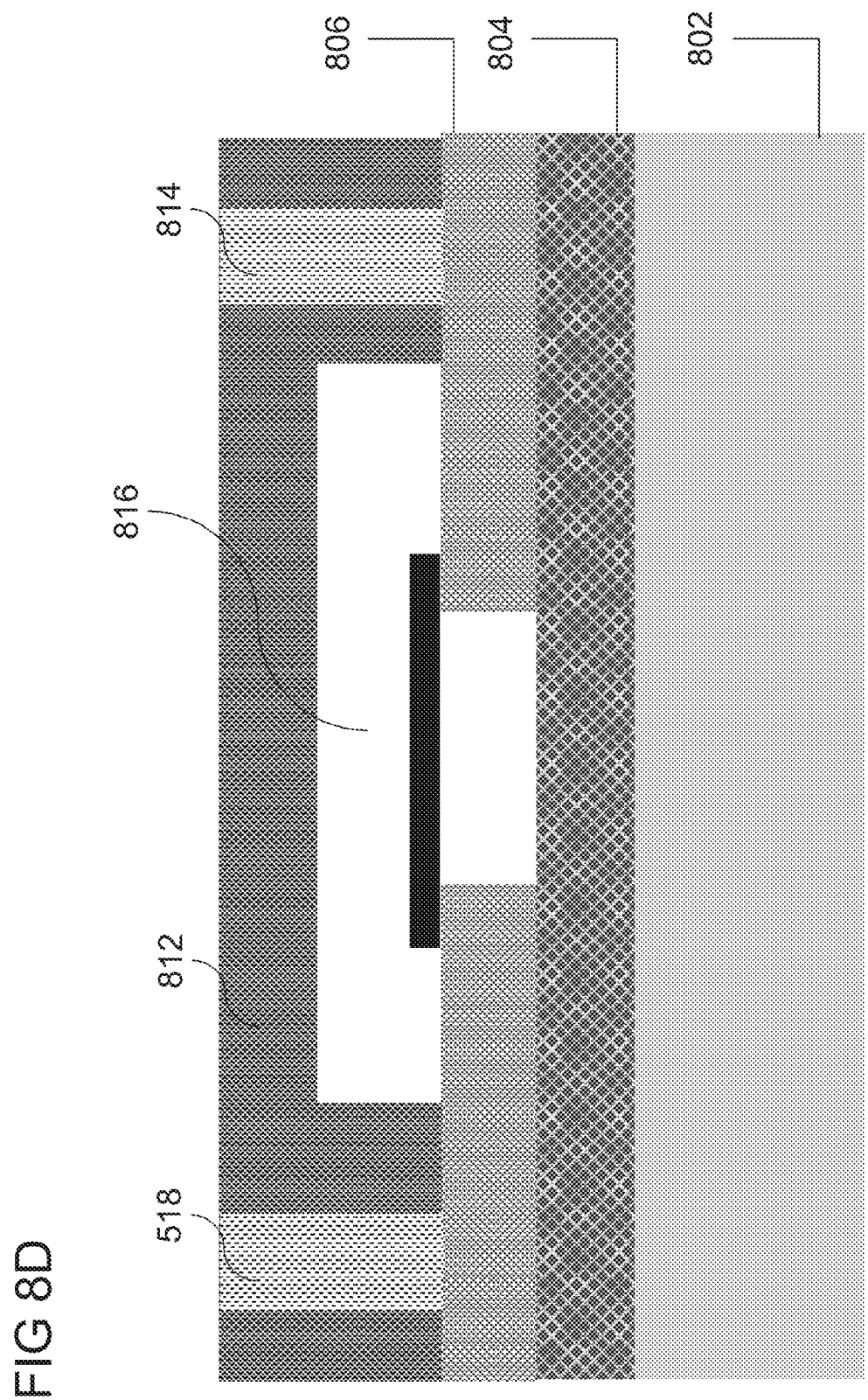

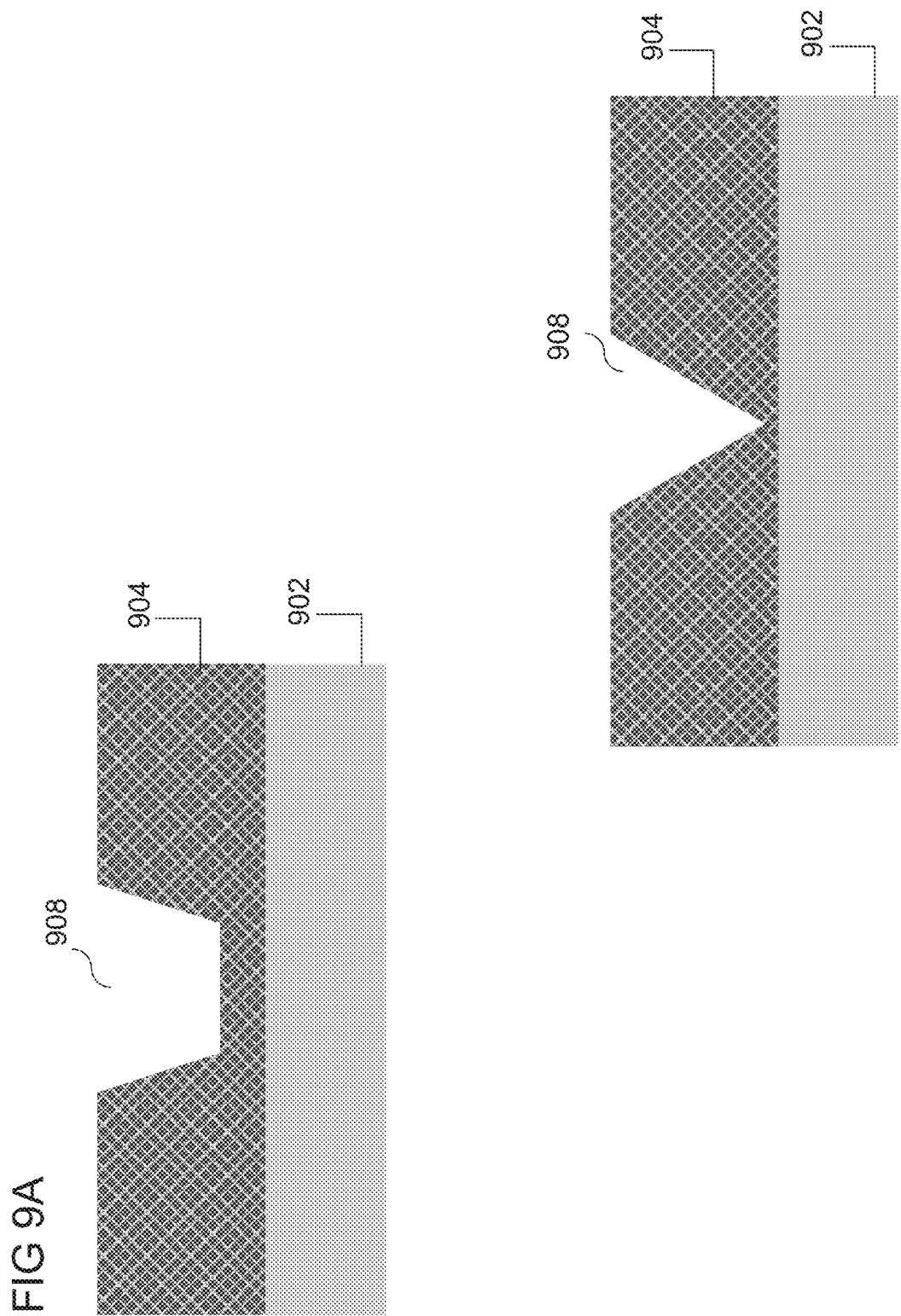

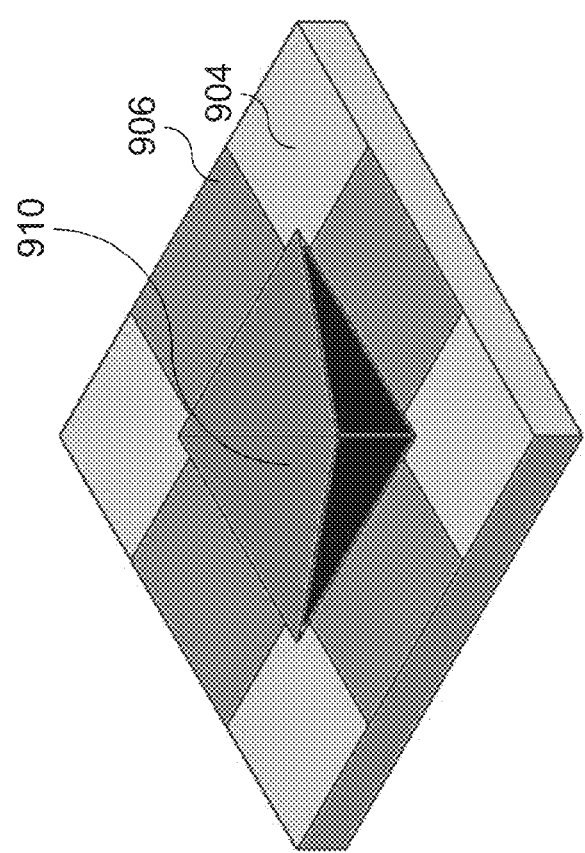
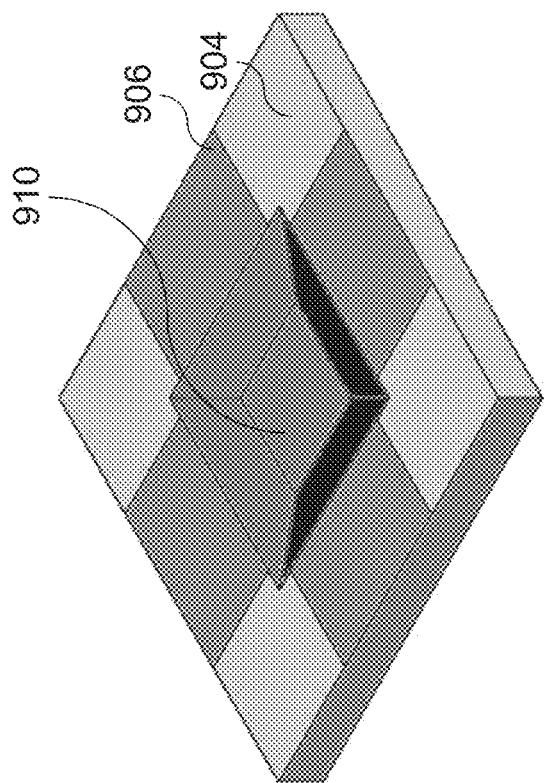
FIG 9B

HALL EFFECT SENSOR WITH GRAPHENE DETECTION LAYER

CROSS-REFERENCE TO RELATED APPLICATION

This application claims the benefit of U.S. Provisional Application No. 61/891,484, filed on Oct. 16, 2013.

TECHNICAL FIELD

Various embodiments relate generally to a Hall Effect sensor with a graphene detection layer implemented in a variety of geometries with the option for integration in a BiCMOS process and a method for producing said Hall Effect sensor.

BACKGROUND

The so called "Hall Effect" occurs when a magnetic field is oriented perpendicular to an electric current. The magnetic field generates a voltage difference across a conductor, called the Hall Voltage, in a direction which is perpendicular to both the direction of the magnetic field and the direction of the current flow. By measuring the Hall Voltage it is possible to determine the size of the component of the magnetic field. Typical Hall sensors usually include a strip or plate of an electrically conductive material with an electric current flowing through the plate. When the plate is positioned in a magnetic field such that a component of the field is perpendicular to the plate, a Hall Voltage is generated within the plate in a direction that is perpendicular to both the direction of the magnetic field and the direction of the current flow. Semiconductor Hall Effect sensors produced using current techniques typically include a sensing element produced from silicon. The magnetic sensitivity of these devices is directly related to, and limited by, the electron mobility, $\mu$ of the material used to construct the sensing element. Silicon typically has an electron mobility of approximately 1500 cm^2/(V·s). Graphene, by contrast, may have an electron mobility in the range of 4500-40000 cm^2/(V·s). Consequently, a Hall Effect device employing a sensing element constructed from graphene will have a much higher magnetic sensitivity than a typical silicon based device.

SUMMARY

In accordance with various embodiments, a method for formed a Hall sensor with a graphene detection layer is disclosed. The method may include: providing a substrate; forming a metal seed layer on the substrate; and forming a graphene detection layer in on the metal seed layer. The graphene detection layer may be embodied in various geometric configurations, depending on the specification and demands of a given application. The method may also include configuring the graphene layer geography such that a full 3D Hall sensor is formed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A through 1J show, in accordance with various embodiments, a perspective progression of a method of forming a Hall Effect Sensor as well as several embodiments of a Hall Effect sensor;

FIGS. 2A through 2E show, in accordance with various embodiments, a perspective progression of a method of forming a Hall Effect Sensor as well as several additional embodiments of a Hall Effect sensor;

FIG. 4 depicts, in both cross-sectional and overhead views, a potential embodiment of a Hall Sensor where the sensing element is encapsulated;

FIGS. 5A through 5C depict, in both cross-sectional and overhead views, a perspective progression of a method of forming a Hall Effect Sensor as well as several embodiments of a Hall Effect sensor;

FIGS. 7A & 7B illustrate additional steps and/or features which may be implemented in the Hall sensor depicted in FIGS. 5A through 5C;

FIGS. 8A through 8D show, in accordance with various embodiments, a perspective progression of a method of forming a Hall Effect Sensor as well as several additional embodiments of a Hall Effect sensor;

FIGS. 9A & B depict, in accordance with an embodiment, a perspective progression of a method of forming a 3-D Hall Effect Sensor as well as perspective embodiments of a 3-D Hall Effect sensor;

DESCRIPTION

Figure 1A:
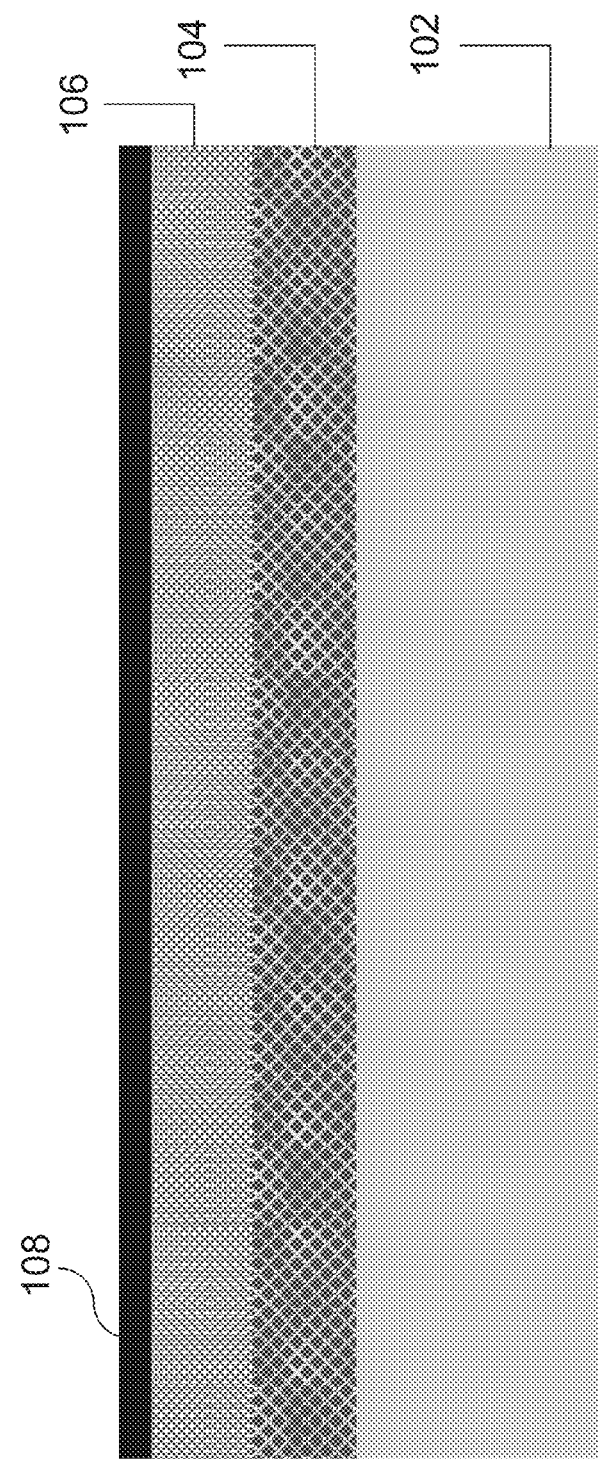

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In typical Hall sensors, factors known to affect sensitivity and residual offset include flocculation, precipitation characteristics, stress, and the influence of the seed layer and the boundary between the seed layer and the graphene. According to the disclosure, the combination of deposition of the graphene layer on a metal seed layer and the removal of the metal seed layer for producing a surface micromechanical sensor structure creates a sensor structure with optimized performance. (e.g. reduction of residual offset, stress, and interfacial effects) By configuring the graphene in various geometries of the residual offset can be further reduced and performance may be further optimized.

Various embodiments relate generally to a method for forming a Hall-Effect sensor with a graphene detection layer. Various embodiments further disclose a Hall sensor with graphene as a detection layer which provides optimized properties in various geometric configurations and the option to integrate in a BiCMOS (hybrid bipolar transistor-CMOS) process. with at least one graphene layer suspended in cavity formed in/Embedded environment as the sensor element. At least one embodiment relates to the stress-free mounting of the Hall element to reduce the residual offset and increase the performance of Hall sensor. A further embodiment provides for a 3D Hall sensor with high sensitivity to magnetic fields while reducing space requirements as compared to currently available technologies. In at least one embodiment, the graphene detection layer may be embedded in a semiconductor substrate to protect the sensing structure from environmental influences that may alter the efficiency, sensitivity, and accuracy of the sensor. In at least one embodiment, the graphene layer maybe formed a cavity which is covered by a capping element and configured such that a partial vacuum is formed in the cavity.

According to various embodiments, a Hall sensor in a so-called "Hall pyramid" configuration is disclosed. The Hall sensor may employ a graphene layer as a magnetically sensitive layer. In at least one embodiment, the graphene layer may be substantially pyramid shaped. This pyramid shape allows a for a full 3D Hall sensor which can be operated in the so-called "chopping mode". In further embodiments, the Hall sensor is available in a pyramid shape with bottom contact or top contact options.

According to various embodiments, the graphene Hall sensor may be encapsulated to better protect the Hall sensor from various environmental influences.

According to various embodiments, the Hall sensor may be formed by the application of a graphene layer onto a metal seed layer. Said seed layer may consist of or may be composed from copper, nickel, copper-nickel alloys, and other various elemental metals or metal alloys as are appropriate for a given application. According to various embodiments, the graphene layer may be formed through the use of various deposition techniques, e.g. in situ deposition, transfer deposition such as by liquid medium transfer or film transfer, etc.

According to various embodiments, as shown as a cross-sectional representation in FIG. 1A, the hall sensor may include a substrate 102, with an oxide layer 104 formed on the substrate 102, a metal layer 106 formed on the oxide layer 104, and a graphene layer 108 formed on the oxide layer 104.

According to various embodiments, substrate 102 may be a semiconductor substrate, e.g. a silicon substrate. According to at least one embodiment, the substrate 102 may include or may be composed of material appropriate for a given application, for example a semiconductor material such as germanium, silicon germanium, silicon carbide, gallium nitride, gallium arsenide, indium, indium gallium nitride, indium gallium arsenide, indium gallium zinc oxide, or other elemental and/or compound semiconductors. The substrate 102 may also include other materials or combinations of material, for example various dielectrics, metals, and polymers as are appropriate for a given application. The substrate 102 may further include or may be composed of, for example, glass. According to at least one embodiment, the substrate 102 may be a silicon-on-insulator (SOI) carrier.

According to various embodiments, the oxide layer 104 may be formed on substrate 102 by using various deposition techniques such as physical vapor deposition, chemical vapor deposition, electrochemical deposition, and various forms of epitaxy such as molecular beam epitaxy and liquid-phase epitaxy. The oxide layer 104 may be any thickness as is appropriate for a given application and/or to achieve a desired characteristic.

According to various embodiments, the oxide layer 104 may include or may be composed of various semiconductor oxides, for example, silicon dioxide.

According to various embodiments, the metal layer 106 may be formed on the oxide layer 104 by using various deposition techniques such as physical vapor deposition, chemical vapor deposition, electrochemical deposition, and various forms of epitaxy such as molecular beam epitaxy. The metal layer 106 may be any thickness as is appropriate for a given application and/or to achieve a desired characteristic.

Figure 1B:
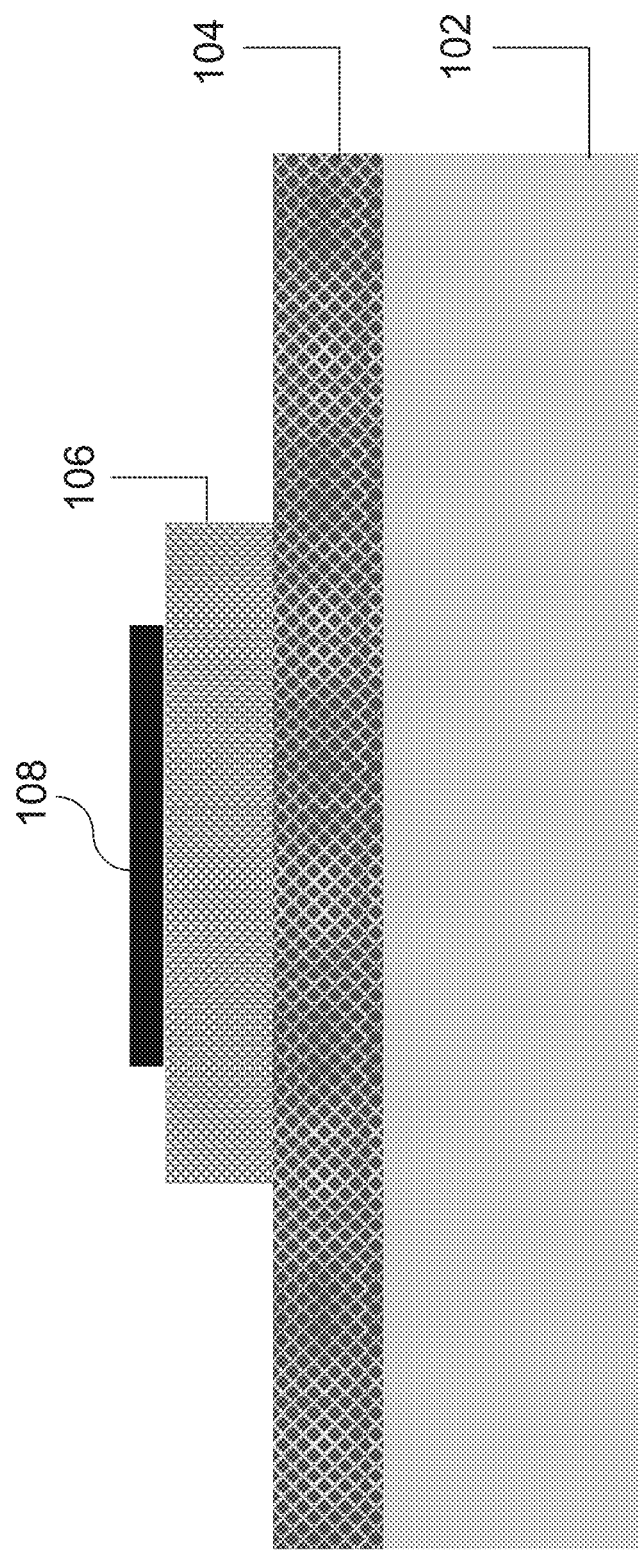
Figure 1C:
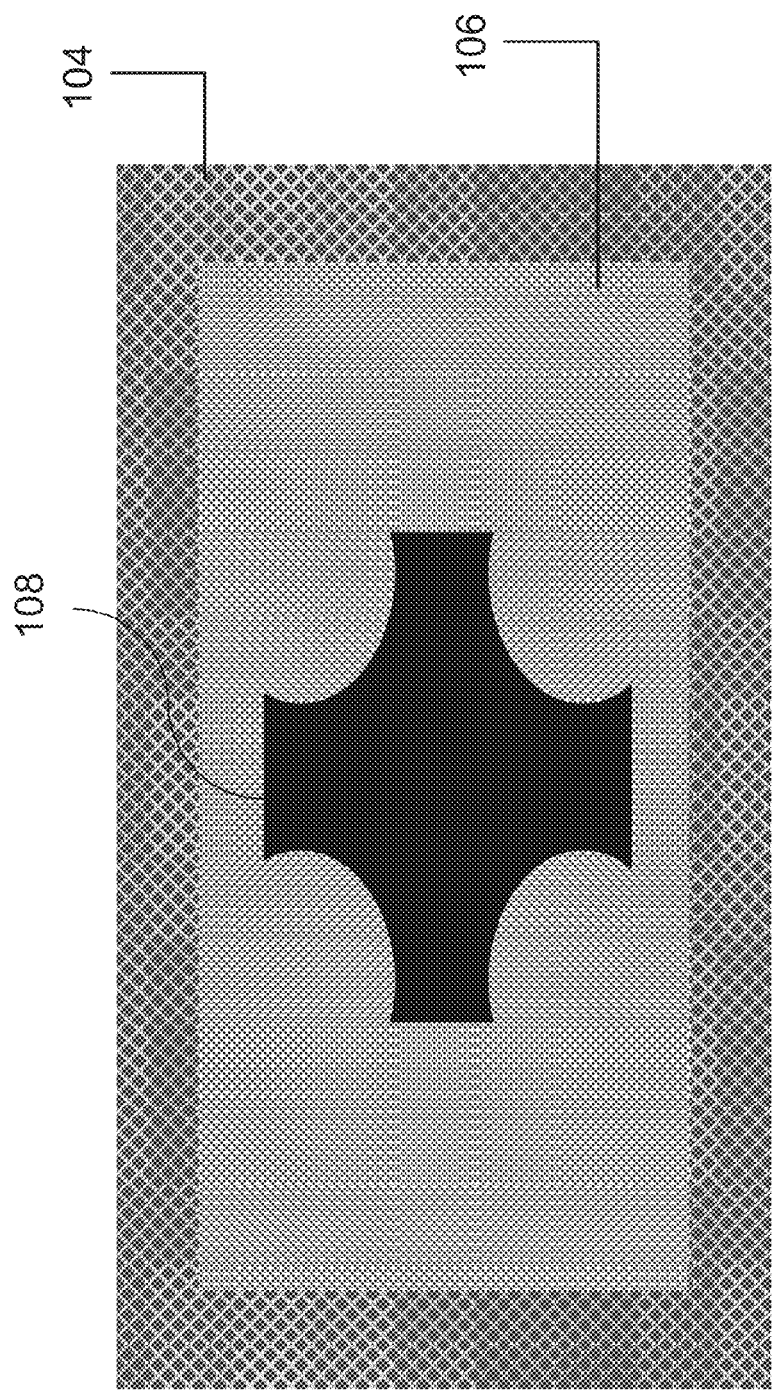

According to various embodiments the Hall Effect sensor may include, as shown in FIGS. 1B & 1C, shaping the metal layer 106 and the graphene layer 108 through various patterning techniques. For example, graphene layer 108 may be formed as shown in FIGS. 1B & 1C, through a photolithography patterning technique. Likewise, the metal layer 106 may be formed as shown in FIGS. 1B & 1C through various etching techniques, e.g. isotropic gas phase etching, vapor etching, wet etching, isotropic dry etching, plasma etching, etc.

According to various embodiments, the metal layer 106 may include or may be composed of various metals, for example, copper or nickel. Some other metals or metal alloys that may be used according to various embodiments include: Ag, Al, Cu, Ni, Sn, CuNi, CuAl, and CnSn. The metal layer 106 may be formed from any elemental metal or metal alloy as appropriate for a given application.

Figure 1F:
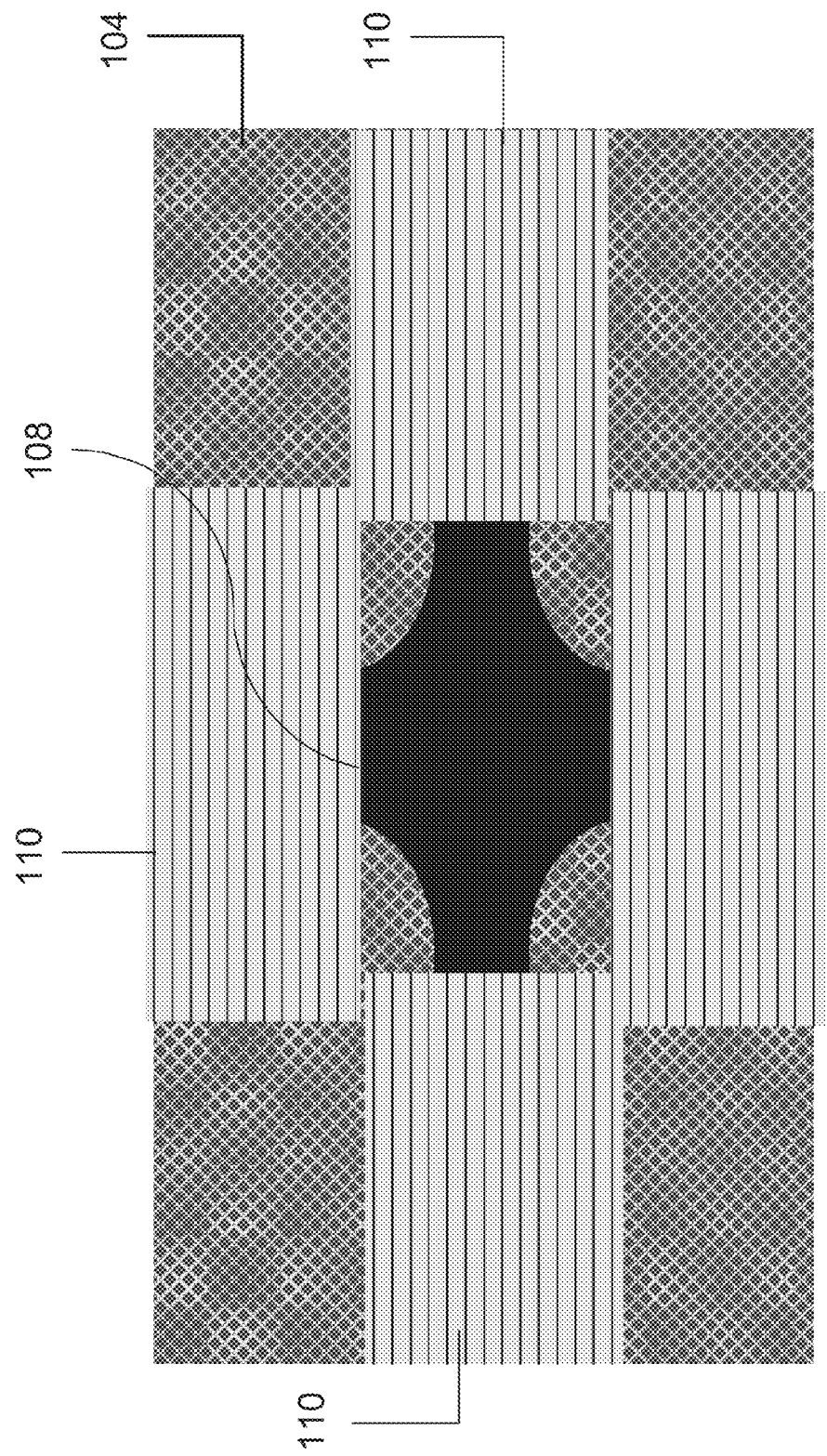

According to various embodiments the Hall sensor may include, as shown in FIGS. 1D-1F, a patterning layer 110 over the oxide layer 104. In at least one embodiment, the pattering layer 110 may be a polycrystalline silicon layer. The Hall sensor may further include removing at least a portion of the metal layer 106 through a patterning process such as, e.g. photolithography and/or various etching techniques. In at least one embodiment, as shown in FIG. 1E, the patterning process may shape the metal layer 106 such that contact pads 112 are formed and the graphene layer 108 is suspended between the contact pads 112.

According to various embodiments the Hall sensor may further include, as shown in FIGS. 1G & 1H, connecting wires 114 to contact pads 112. In at least one embodiment, the wires 114 may be used to electrically connect the contact pads 112 to a further structure (not shown). According to an embodiment, the wires 114 may be used to wire bond contact pads 112 to said further structure.

Figure 1I:
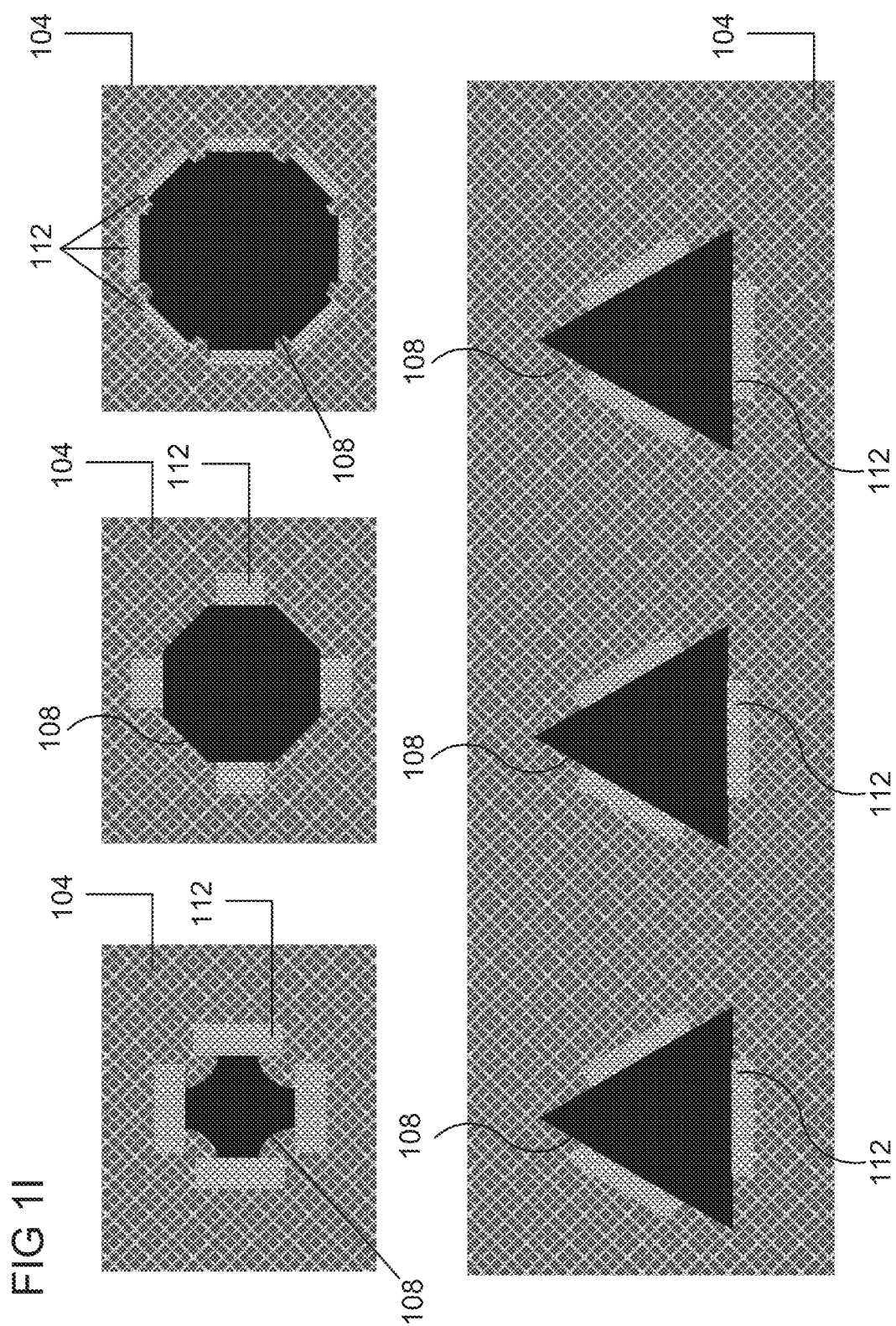

According to various embodiments the Hall sensor may further include, as shown in FIG. 1I, the graphene layer 108 may be configured in various geometries, for example graphene layer 108 may be: an octagon or substantially octagonal, a triangle or substantially triangular, a quatrefoil or substantially quatrefoil shaped, or a circle or substantially circular. Similarly, depending on the geometry of graphene layer 108, the number of contact pads 112 and corresponding wires 114 may be altered to fit a given application.

According to various embodiments the Hall sensor may further include, as shown in FIG. 1G, a stress-reducing mounting structure 116, arranged between the graphene layer 108 and the contact pads 112. According to various embodiments, the stress-reducing mounting structure 116 may be formed out of at least a portion of the graphene layer 108.

Figure 2A:
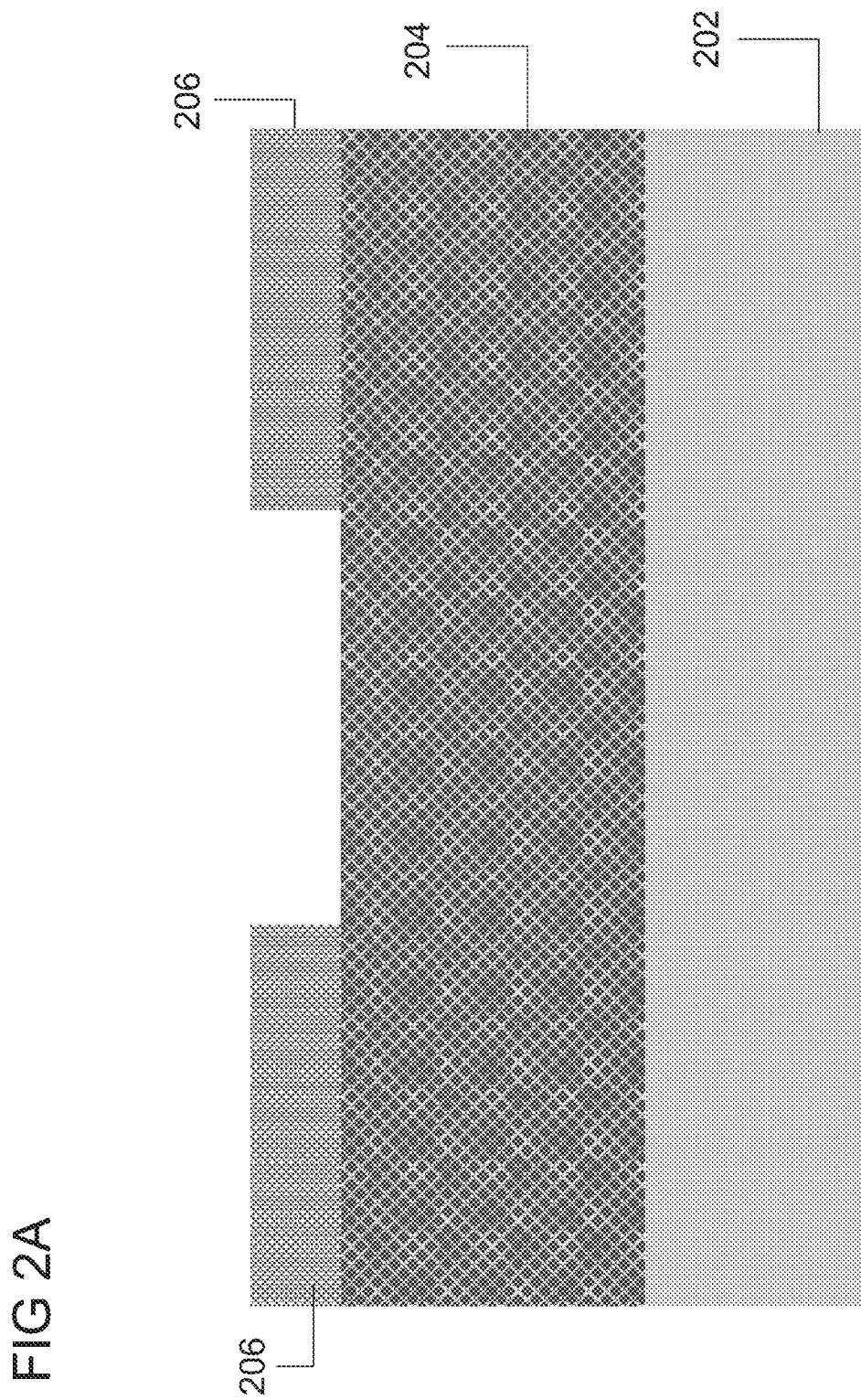
Figure 2B:
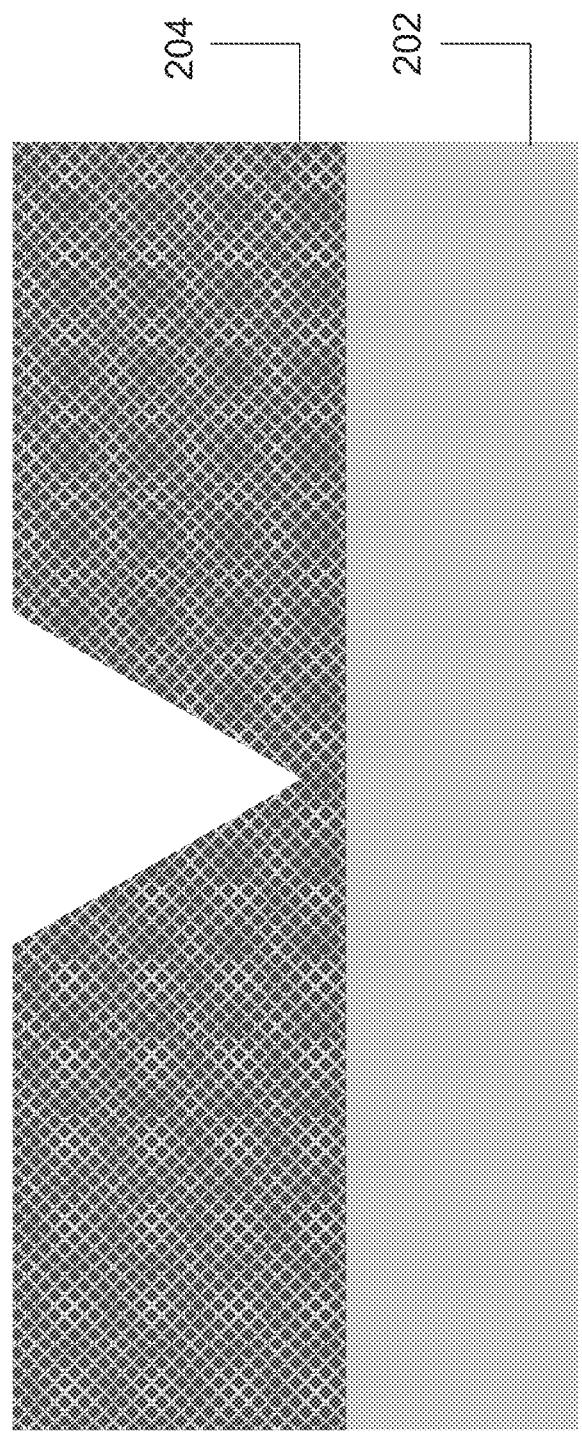

According to various embodiments the Hall sensor may further include, as shown in FIGS. 2A-2C, a substrate 202, with an epitaxy layer 204 formed on the substrate 202, a metal layer 208 formed on the epitaxy layer 204, a graphene layer 210 formed on the epitaxy layer 204, and covering the epitaxy layer 204 with a pattering layer 212.

According to various embodiments the method may include, as shown in a cross-sectional representation in FIG. 1A, providing a substrate 102, with an oxide layer 104 formed on the substrate 102, a metal layer 106 formed on the oxide layer 104, and a graphene layer 108 formed on the oxide layer 104.

According to various embodiments, substrate 102 may be a semiconductor substrate, e.g. a silicon substrate. According to at least one embodiment, the substrate 102 may include or may be composed of material appropriate for a given application, for example a semiconductor material such as germanium, silicon germanium, silicon carbide, gallium nitride, gallium arsenide, indium, indium gallium nitride, indium gallium arsenide, indium gallium zinc oxide, or other elemental and/or compound semiconductors. The substrate 102 may also include other materials or combinations of material, for example various dielectrics, metals, and polymers as are appropriate for a given application. The substrate 102 may further include or may be composed of, for example, glass. According to at least one embodiment, the substrate 102 may be a silicon-on-insulator (SOI) carrier.

According to various embodiments, the oxide layer 104 may be formed on substrate 102 by using various deposition techniques such as physical vapor deposition, chemical vapor deposition, electrochemical deposition, and various forms of epitaxy such as molecular beam epitaxy and liquid-phase epitaxy. The oxide layer 104 may be any thickness as is appropriate for a given application and/or to achieve a desired characteristic.

According to various embodiments, the oxide layer 104 may include or may be composed of various semiconductor oxides, for example, silicon dioxide.

According to various embodiments, the metal layer 106 may be formed on the oxide layer 104 by using various deposition techniques such as physical vapor deposition, chemical vapor deposition, electrochemical deposition, and various forms of epitaxy such as molecular beam epitaxy. The metal layer 106 may be any thickness as is appropriate for a given application and/or to achieve a desired characteristic.

According to various embodiments the method may include, as shown in FIGS. 1B & 1C, shaping the metal layer 106 and the graphene layer 108 through various patterning techniques. For example, graphene layer 108 may be formed as shown in FIGS. 1B & 1C, through a photolithography patterning technique. Likewise, the metal layer 106 may be formed as shown in FIGS. 1B & 1C through various etching techniques, e.g. isotropic gas phase etching, vapor etching, wet etching, isotropic dry etching, plasma etching, etc.

According to various embodiments, the metal layer 106 may include or may be composed of various metals, for example, copper or nickel. Some other metals or metal alloys that may be used according to various embodiments include: Ag, Al, Cu, Ni, Sn, CuNi, CuAl, and CnSn. The metal layer 106 may be formed from any elemental metal or metal alloy as appropriate for a given application.

According to various embodiments the method may include, as shown in FIGS. 1D-1F, applying a patterning layer 110 over the oxide layer 104. In at least one embodiment, the pattering layer 110 may be a polycrystalline silicon layer. The method may further include removing at least a portion of the metal layer 106 through a patterning process such as, e.g. photolithography and/or various etching techniques. In at least one embodiment, as shown in FIG. 1E, the patterning process may shape the metal layer 106 such that contact pads 112 are formed and the graphene layer 108 is suspended between the contact pads 112.

According to various embodiments the method may further include, as shown in FIGS. 1G & 1H, connecting wires 114 to contact pads 112. In at least one embodiment, the wires 114 may be used to electrically connect the contact pads 112 to a further structure (not shown). According to an embodiment, the wires 114 may be used to wire bond contact pads 112 to said further structure.

According to various embodiments the method may further include, as shown in FIG. 1I, the graphene layer 108 may be configured in various geometries, for example graphene layer 108 may be: an octagon or substantially octagonal, a triangle or substantially triangular, a quatrefoil or substantially quatrefoil shaped, or a circle or substantially circular. Similarly, depending on the geometry of graphene layer 108, the number of contact pads 112 and corresponding wires 114 may be altered to fit a given application.

According to various embodiments, the graphene layer 108 may be composed of and/or may include various metal chalcogenides like molybdenum disulfide, tungsten diselenide, vanadium diselenide, etc. In some embodiments, the graphene layer 108 may be composed of and/or may include elemental allotropes like silicene, germanane, germanene, or phosphorene, etc.

Figure 1J:
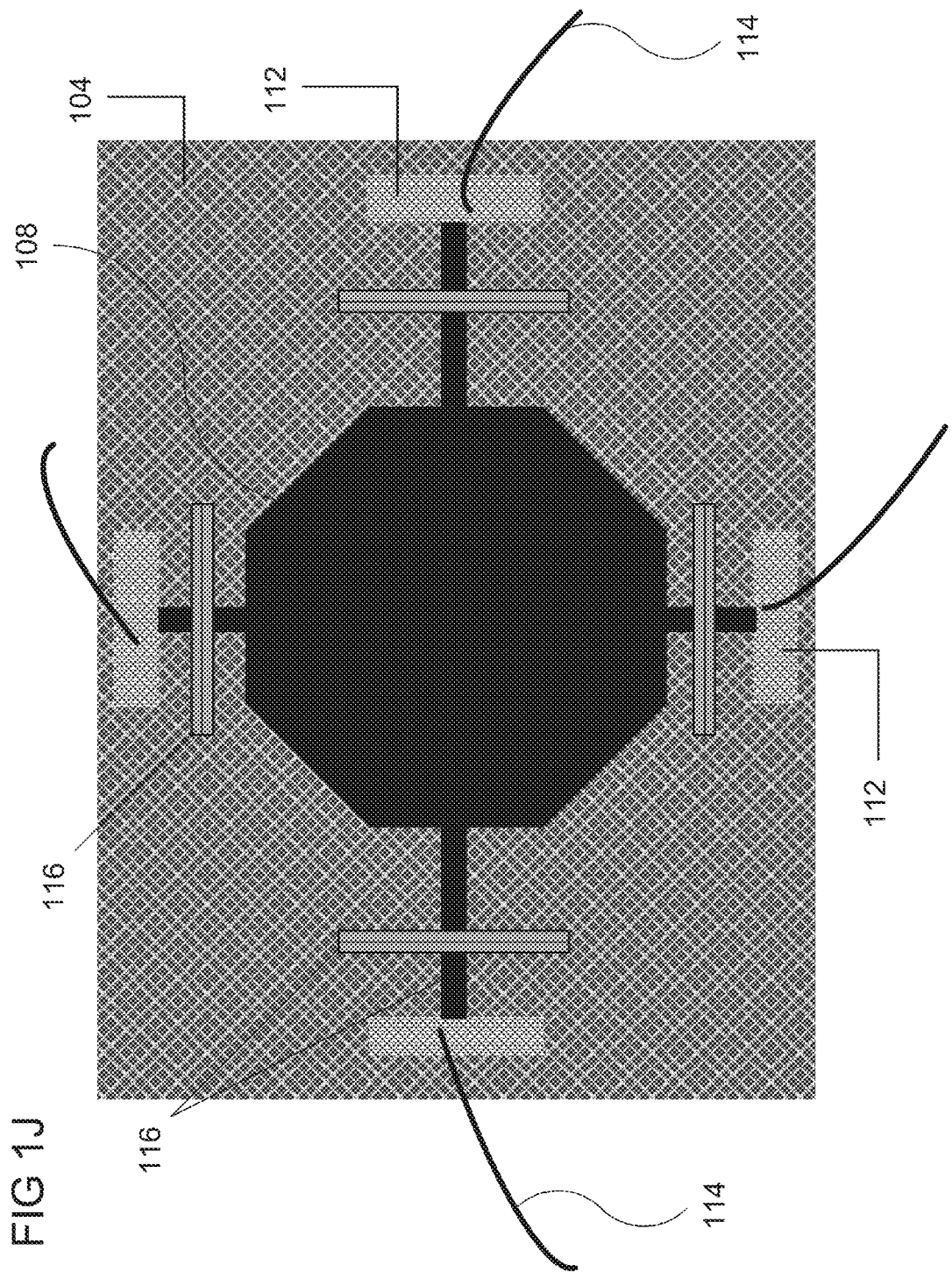

According to various embodiments the method may further include, as shown in FIG. 1J, arranging a stress-reducing mounting structure 116 between the graphene layer 108 and the contact pads 112. According to various embodiments, the stress-reducing mounting structure 116 may be formed out of at least a portion of the graphene layer 108.

According to various embodiments the method may further include, as shown in FIGS. 2A-2C, providing a substrate 202, with an epitaxy layer 204 formed on the substrate 202, a metal layer 208 formed on the epitaxy layer 204, a graphene layer 210 formed on the epitaxy layer 204, and covering the epitaxy layer 204 with a pattering layer 212.

According to various embodiments, as shown in FIG. 2D, the method may further include forming openings 222 through the patterning layer 212.

According to various embodiments, as shown in FIG. 2E, the method may further include structuring the metal layer 208 to form the contact pads 214. In some embodiments, the contact pads 214 may be formed along the perimeter and/or periphery of the epitaxy layer 204. According to various embodiments, the structuring of the metal layer 208 may cause a void to be opened between a portion of the graphene layer 210 and the epitaxy 204. In other words, a portion of the graphene layer 210 may become suspended above and/or over a portion of the epitaxy layer 204. In some embodiments, the method may further include forming a structural fill layer 216 over the graphene layer 210. According to various embodiments, the method may further include forming a top contact 218 and a top contact via structure 220.

According to various embodiments, the top contact 218 may be electrically coupled to the graphene layer 210 by the top contact via structure 220.

According to various embodiments, the substrate 202, may include or essentially consist of a semiconductor material such as germanium, silicon germanium, silicon carbide, gallium nitride, indium, indium gallium nitride, indium gallium arsenide, indium gallium zinc oxide, or other elemental and/or compound semiconductors, e.g. a III-V compound semiconductor such as e.g. gallium arsenide or indium phosphide, or a II-VI compound semiconductor or a ternary compound semiconductor or a quaternary compound semiconductor, as may be desired for a given application. The substrate 202 may include or essentially consist of, for example, glass, and/or various polymers. The substrate 202 may be a silicon-on-insulator (SOI) structure. In some embodiments the substrate 202 may be a printed circuit board. According to various embodiments, the substrate 202 may be a flexible substrate, such as a flexible plastic substrate, e.g. a polyimide substrate. In various embodiments, the substrate 202 may be composed of or may include one or more of the following materials: a polyester film, a thermoset plastic, a metal, a metalized plastic, a metal foil, and a polymer. In various embodiments, the substrate 202 may be a flexible laminate structure. According to various embodiments, the substrate 202 may be a semiconductor substrate, such as a silicon substrate. In some embodiments, the substrate 202 may be a multilayer substrate, e.g. a multilayer polymer, multilayer glass-ceramic, multilayer glass-ceramic copper, etc. The substrate 202 may include or essentially consist of other materials or combinations of material, for example various dielectrics, metals, and polymers as may be desirable for a given application. In various embodiments, the substrate 202 may have a thickness in the range from about 100 µm to about 700 µm, e.g. in the range from about 150 µm to about 650 µm, e.g. in the range from about 200 µm to about 600 µm, e.g. in the range from about 250 µm to about 550 µm, e.g. in the range from about 300 µm to about 500 µm, e.g. in the range from about 350 µm to about 450 µm. In some embodiments, the substrate 202 may have a thickness of at least about 100 µm, e.g. of at least 150 µm, e.g. of at least 200 µm, e.g. of at least 250 µm, e.g. of at least 300 µm. In various embodiments, the substrate 202 may have a thickness of less than or equal to about 700 µm, e.g. of less than or equal to 650 µm, e.g. of less than or equal to 600 µm, e.g. of less than or equal to 550 µm, e.g. of less than or equal to 500 µm. According to various embodiments, the substrate 202 may have a thickness which may be any thickness desirable for a given application. In various embodiments, the substrate 202 may be square or substantially square in shape. The substrate 202 may be rectangular or substantially rectangular in shape. According to various embodiments, the substrate 202 may be a circle or substantially circular in shape. The substrate 202 may be an oval or substantially oval-like in shape. According to various embodiments, the substrate 202 may be a triangle or substantially triangular in shape. The substrate 202 may be a cross or substantially cross shaped. According to various embodiments, the substrate 202 may be formed into any shape that may be desired for a given application.

According to various embodiments, the epitaxy layer 204 may be formed through and epitaxy process such as by molecular beam epitaxy or metal organic chemical vapor deposition. The epitaxy layer 204 may include or may be composed of various semiconductor oxides, for example, silicon dioxide. The epitaxy layer 204 may be composed of or may essentially consist of a semiconductor material such as germanium, silicon germanium, silicon carbide, gallium nitride, indium, indium gallium nitride, indium gallium arsenide, indium gallium zinc oxide, or other elemental and/or compound semiconductors, e.g. a III-V compound semiconductor such as e.g. gallium arsenide or indium phosphide, or a II-VI compound semiconductor or a ternary compound semiconductor or a quaternary compound semiconductor, as may be desired for a given application. According to various exemplary embodiments, the epitaxy layer 204 may be composed of or may include a combination of elements such as aluminum, nitrogen, phosphorus, arsenic, indium, gallium, and/or gallium nitride. The epitaxy layer 204 may include or essentially consist of other materials or combinations of material, for example various dielectrics, metals, and polymers as may be desirable for a given application. In various embodiments, the epitaxy layer 204 may have a thickness in the range from about 200 µm to about 2000 µm, e.g. in the range from about 200 µm to about 450 µm, e.g. in the range from about 450 µm to about 800 µm, e.g. in the range from about 800 µm to about 1000 µm, e.g. in the range from about 1000 µm to about 1200 µm, e.g. in the range from about 1200 µm to about 1450 µm. According to various embodiments, the epitaxy layer 204 may have a thickness which may be any thickness desirable for a given application. In various embodiments, the epitaxy layer 204 may be square or substantially square in shape. The epitaxy layer 204 may be rectangular or substantially rectangular in shape. According to various embodiments, the epitaxy layer 204 may be a circle or substantially circular in shape. The epitaxy layer 204 may be an oval or substantially oval-like in shape. According to various embodiments, the epitaxy layer 204 may be a triangle or substantially triangular in shape. The epitaxy layer 204 may be a cross or substantially cross shaped. According to various embodiments, the epitaxy layer 204 may be formed into any shape that may be desired for a given application.

According to various embodiments, the method may include a patterning layer 206 over the epitaxy layer 204. In at least one embodiment, the pattering layer 206 may be a polycrystalline silicon layer, in some embodiments the patterning layer 206 may be a photoresist of various photopolymers, photo-resins, thermoplastics, and photoresists, e.g. various acrylates, methacrylates, photoinitiators, epoxide resins, negative photoresists, and positive photoresists.

According to various embodiments, the metal layer 208 may include or may be composed of various metals, e.g. copper, nickel, tin, lead, silver, gold, aluminum, titanium, gallium, indium, boron, and various alloys of these metals such as e.g. cupronickel, nickel-aluminum, aluminum-copper-silicon, etc. The metal layer 208 may include or be composed of various other materials, e.g. a metallic material, a metal foil, a solder wettable material, various metal alloys and/or compound metals, and various elemental metals as may be desirable for a given application. In various embodiments, the metal layer 208 may be square or substantially square in shape. The metal layer 208 may be rectangular or substantially rectangular in shape. According to various embodiments, the metal layer 208 may be a circle or substantially circular in shape. The metal layer 208 may be an oval or substantially oval-like in shape. According to various embodiments, the metal layer 208 may be a triangle or substantially triangular in shape. The metal layer 208 may be a cross or substantially cross shaped. According to various embodiments, the metal layer 208 may be formed into any shape that may be desired for a given application. In various embodiments, the metal layer 208 may be deposited through various techniques, e.g. vapor deposition, an electrochemical process, and electroplating process, an electroless process, a chemical vapor deposition process, molecular beam epitaxy, spin coating, a sputter deposition, and/or various other techniques as may be desirable for a given application. According to various embodiments, the metal layer 208 may have a thickness in the range from about 20 nm to about 500 nm, e.g. in the range from about 20 nm to about 30 nm, e.g. in the range from about 30 nm to about 40 nm, e.g. in the range from about 40 nm to about 50 nm, e.g. in the range from about 50 nm to about 100 nm, e.g. in the range from about 100 nm to about 150 nm, e.g. in the range from about 150 nm to about 200 nm, e.g. in the range from about 200 nm to about 250 nm, e.g. in the range from about 250 nm to about 300 nm, e.g. in the range from about 300 nm to about 350 nm, e.g. in the range from about 350 nm to about 500 nm. According to an embodiment, the metal layer 208 may have any thickness that may be desirable for a given application.

According to various embodiments, the graphene layer 210 may have a thickness from about 0.3 nm to about 10 nm, e.g. from about 0.3 nm to about 0.7 nm, e.g. in the range from about 0.7 nm to about 1.0 nm, e.g. in the range from about 1 nm to about 1.3 nm, e.g. in the range from about 1.3 nm to about 1.7 nm, e.g. in the range from about 1.7 nm to about 2.0 nm, e.g. in the range from about 2.0 nm to about 2.3 nm, e.g. in the range from about 2.3 nm to about 2.7 nm, e.g. in the range from about 2.7 nm to about 3.0 nm, e.g. in the range from about 3.0 nm to about 3.3 nm, e.g. in the range from about 3.3 nm to about 3.7 nm, e.g. in the range from about 3.7 nm to about 4.0 nm, e.g. in the range from about 4.0 nm to about 4.3 nm, e.g. in the range from about 4.3 nm to about 4.7 nm, e.g. in the range from about 4.7 nm to about 5.0 nm, e.g. in the range from about 5.0 nm to about 10 nm.

According to various embodiments, the graphene layer 210 may be composed of and/or may include various metal chalcogenides like molybdenum disulfide, tungsten diselenide, vanadium diselenide, etc. In some embodiments, the graphene layer 210 may be composed of and/or may include elemental allotropes like silicene, germanane, germanene, or phosphorene, etc.

According to various embodiments, the patterning layer 212 may be a polycrystalline silicon layer, in some embodiments the patterning layer 212 may be a photoresist of various photopolymers, photo-resins, thermoplastics, and photoresists, e.g. various acrylates, methacrylates, photoinitiators, epoxide resins, negative photoresists, and positive photoresists. According to various embodiments, the patterning layer 212 may include several openings 222. The openings 222 may extend through both the patterning layer 212 and the graphene layer 210 and may expose the metal layer 208. According to various embodiments, the openings 222 may be used to remove or structure a portion and/or portions of the metal layer 208. The removal and/or structuring of the metal layer 208 may be accomplished through various etching processes, e.g. isotropic gas phase etching, vapor etching, wet etching, isotropic dry etching, plasma etching, etc. In various embodiments, the result of removing portions of the metal layer 208 may be that a portion of the graphene layer 210 becomes suspended above the epitaxy layer 204. Stated another way, removing portions of the metal layer 208 may create a void and/or gap between a part of the graphene layer 210 and the epitaxy layer 204. According to an embodiment, the metal layer may be structured to form several contact pads 214. These contact pads 214 may be in both electrical and physical contact with the graphene layer 210. According to various embodiments, the contact pads 214 may be used to electrically couple the graphene layer 210 to various devices and or further circuitry (not shown).

According to various embodiments, the structural fill layer 216 may be composed of and/or may include a silicate glass such as borophosphosilicate glass or phosphosilicate glass; in some embodiments the fill layer 216 may be composed of or may include a thermoplastic such as high-density polyethylene; an ALD-dielectric such as an aluminum oxide; the fill layer 216 may be composed of or may include various other materials, e.g. hydrogen silsesquioxane, polyimide, polycarbonsilane, etc. In various embodiments, the fill layer 216 may be composed of or may include any material desirable for a give application. According to various embodiments, the structural fill layer 216 may be coextensive with the graphene layer 210. The structural fill layer 216 may completely cover and or seal the openings 222 in the graphene layer 210. According to an embodiment, the structural fill layer 216 may be implemented as a protective layer to insulate and/or isolate the graphene layer 210 from various external atmospheric influences, e.g. moisture, heat, impacts, etc.

According to various embodiments, the top contact 218 may be formed over a surface of the structural fill layer 216. The top contact 218 may be, in some embodiments, located in a geometric center of the structural fill layer 216. According to various embodiments, the top contact 218 may be electrically coupled to the graphene layer by the top contact via structure 220. According to various embodiments, the top contact 218 may have a thickness in the range from about 20 nm to about 500 nm, e.g. in the range from about 20 nm to about 30 nm, e.g. in the range from about 30 nm to about 40 nm, e.g. in the range from about 40 nm to about 50 nm, e.g. in the range from about 50 nm to about 100 nm, e.g. in the range from about 100 nm to about 150 nm, e.g. in the range from about 150 nm to about 200 nm, e.g. in the range from about 200 nm to about 250 nm, e.g. in the range from about 250 nm to about 300 nm, e.g. in the range from about 300 nm to about 350 nm, e.g. in the range from about 350 nm to about 500 nm. According to an embodiment, the top contact 218 may have any thickness that may be desirable for a given application. According to various embodiments, the top contact 218 may include or may be composed of various metals, e.g. copper, nickel, tin, lead, silver, gold, aluminum, titanium, gallium, indium, boron, and various alloys of these metals such as e.g. cupronickel, nickel-aluminum, aluminum-copper-silicon, etc. The top contact 218 may include or be composed of various other materials, e.g. a metallic material, a metal foil, a solder wettable material, various metal alloys and/or compound metals, and various elemental metals as may be desirable for a given application. In various embodiments, the top contact 218 may be square or substantially square in shape. The top contact 218 may be rectangular or substantially rectangular in shape. According to various embodiments, the top contact 218 may be a circle or substantially circular in shape. The top contact 218 may be an oval or substantially oval-like in shape. According to various embodiments, the top contact 218 may be a triangle or substantially triangular in shape. The top contact 218 may be a cross or substantially cross shaped. According to various embodiments, the top contact 218 may be formed into any shape that may be desired for a given application. In various embodiments, the top contact 218 may be deposited through various techniques, e.g. vapor deposition, an electrochemical process, and electroplating process, an electroless process, a chemical vapor deposition process, molecular beam epitaxy, spin coating, a sputter deposition, and/or various other techniques as may be desirable for a given application.

According to various embodiments, the top contact via structure 220 may be formed through the structural fill layer 216 and coupled physically and/or electrically to the graphene layer 210. The top contact via structure 220 may likewise be coupled physically and/or electrically to the top contact 218. The top contact via structure 220 may be composed of and or may include various metals, e.g. copper, nickel, tin, lead, silver, gold, aluminum, titanium, gallium, indium, boron, and various alloys of these metals such as e.g. cupronickel, nickel-aluminum, aluminum-copper-silicon, etc. The top contact via structure 220 may include or be composed of various other materials, e.g. a metallic material, a metal foil, various semiconductor materials doped sufficiently to become substantially conductive, a solder wettable material, various metal alloys and/or compound metals, and various elemental metals as may be desirable for a given application.

According to various embodiments, the top contact 218 may be electrically coupled to a surface of the graphene layer 210 by the top contact via structure 220 and the contact pads 214 may be electrically coupled to a surface of the graphene layer 210. According to an embodiment the contact pads 214, the top contact 218 and the top contact via structure 220 may be configured to allow the measurement of a voltage across the graphene layer 210. In various embodiments, the contact pads 214, the top contact 218 and the top contact via structure 220 may be configured to allow for the measurement of a Hall Effect which may be present in the graphene layer 210.

Figure 3A:
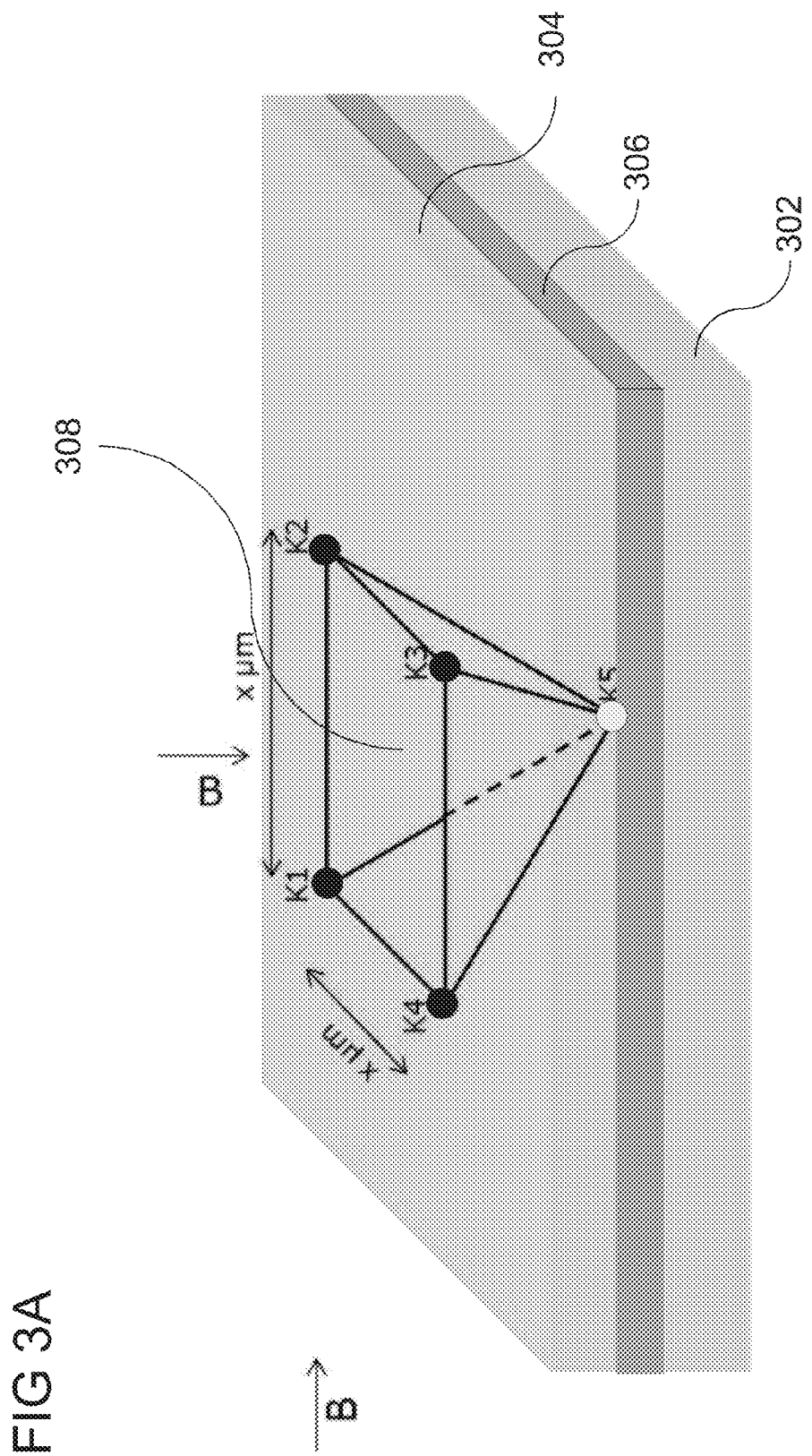
FIGS. 3A through 3C depict various other possible features and embodiments of a Hall Sensor.
Figure 3B:
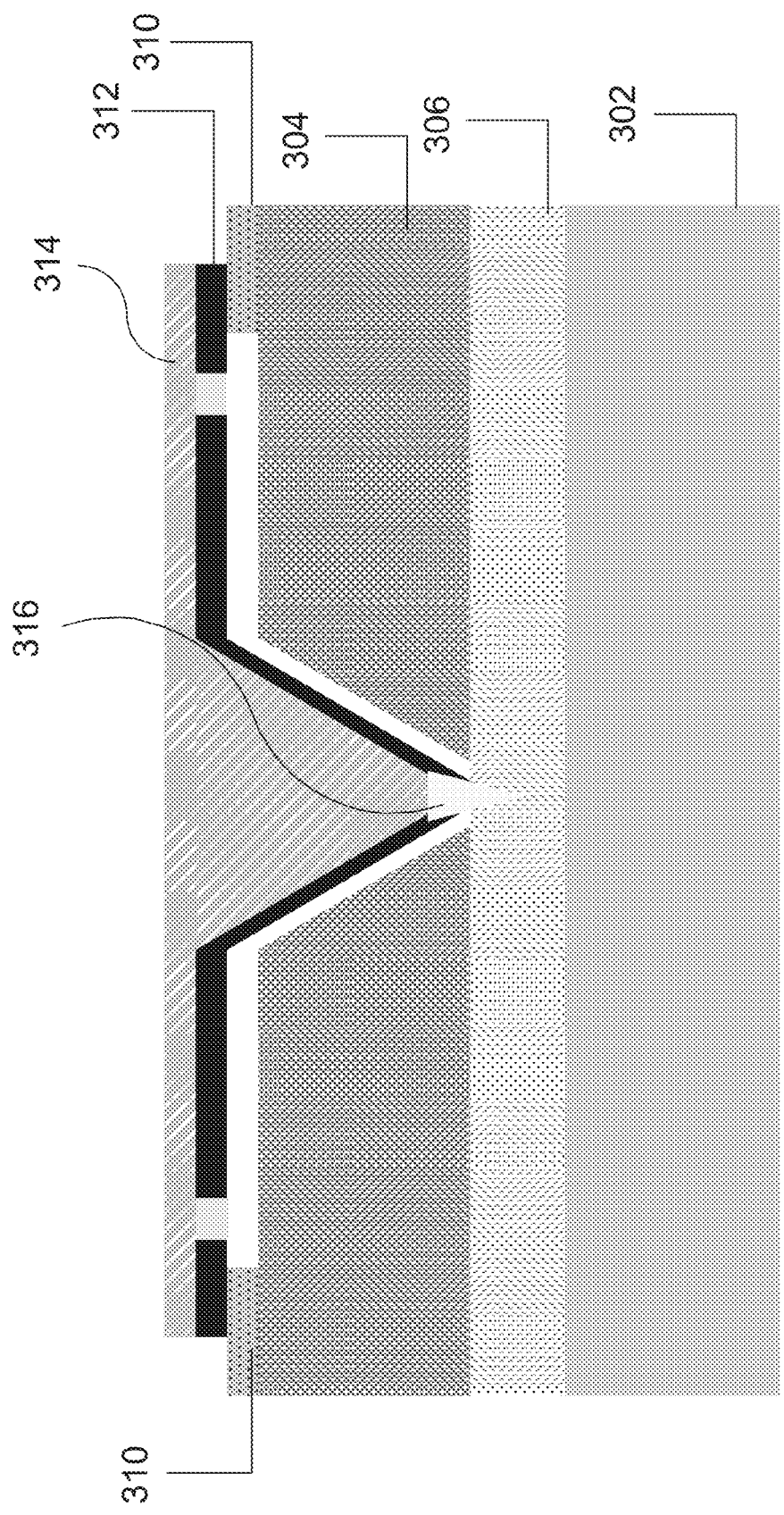
Figure 3C:
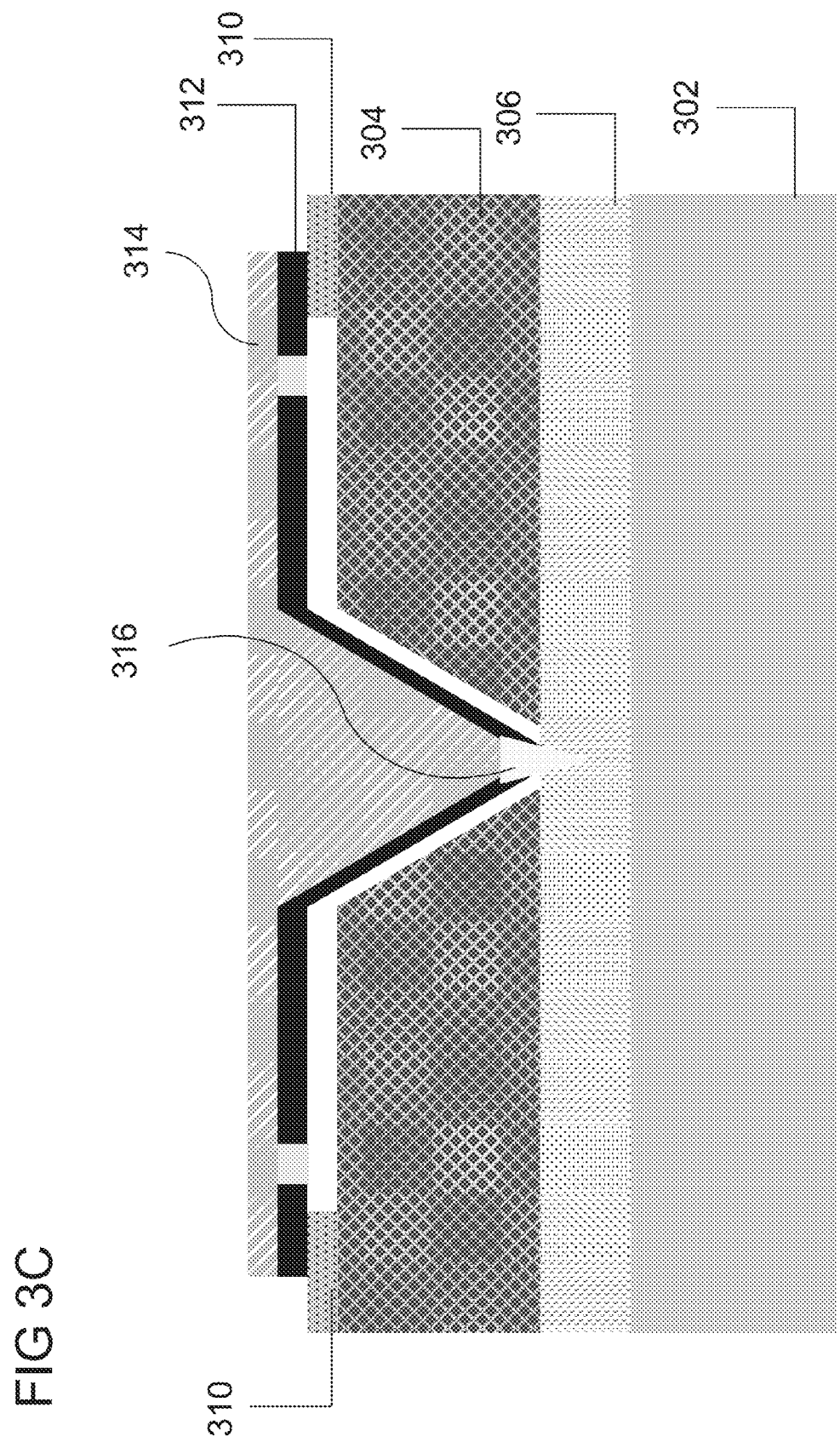

According to various embodiments, the Hall Effect sensor as illustrated in FIGS. 3A-3C, may include a so-called "Hall Pyramid." The Hall Effect sensor may include a substrate 302, a doped semiconductor layer 306 formed on the substrate 302 and an epitaxy layer 304 formed on the doped semiconductor layer 306. According to various embodiments, the Hall Effect sensor may further include a Hall Effect pyramid 308 formed in the epitaxy layer 304. According to various embodiments, the Hall Effect pyramid 308 may have its base formed along a top surface of the epitaxy layer 304, i.e. the surface of the epitaxy layer furthest from the doped semiconductor layer 306. In some embodiments, as illustrated in FIG. 3A, the base of the Hall Effect pyramid 308 may be defined by four points, represented as reference figures K1-K4, on the surface of the epitaxy layer 304. According to an embodiment, the base of the Hall Effect pyramid 308 may be uniplanar with the top surface of the epitaxy layer 304. In some embodiments, the base of the Hall Effect pyramid 308 may be completely covered and/or encased within the epitaxy layer 304. In various embodiments, the apex, represented as reference figure K5, of the Hall Effect pyramid 308 may be located in the doped semiconductor layer 306. The Hall Effect pyramid may be located on the Miller index [111] lattice plane of the epitaxy layer 304. According to various embodiments, the length of a side of the base of the Hall Effect pyramid 308, may be in the range from about 0.25 µm to about 10 µm, e.g. in the range from about 0.25 µm to about 1.0 µm, e.g. in the range from about 1.0 µm to about 1.5 µm, e.g. in the range from about 1.5 µm to about 3.0 µm, e.g. in the range from about 3.0 µm to about 4.5 µm, e.g. in the range from about 4.5 µm to about 6.0 µm, e.g. in the range from about 6.0 µm to about 7.5 µm, e.g. in the range from about 7.5 µm to about 9.0 µm, e.g. in the range from about 9.0 µm to about 10 µm. According to various embodiments, the apex K5 of the Hall Effect pyramid 308 may be in electrical contact with the doped semiconductor layer 306.

In various embodiments, the substrate 302 may be similar to the substrate 202, discussed at length above. The substrate 302 may be composed of or may include similar materials as the substrate 202. The substrate 302 may have similar and/or substantially identical physical and electromagnetic characteristics and properties as the substrate 202. The substrate 302 may be formed or structured through the use of similar process as those used for or on the substrate 202.

According to various embodiments, the doped semiconductor layer 306 may include or essentially consist of a semiconductor material such as germanium, silicon germanium, silicon carbide, gallium nitride, indium, indium gallium nitride, indium gallium arsenide, indium gallium zinc oxide, or other elemental and/or compound semiconductors, e.g. a III-V compound semiconductor such as e.g. gallium arsenide or indium phosphide, or a II-VI compound semiconductor or a ternary compound semiconductor or a quaternary compound semiconductor, as may be desired for a given application. According to an embodiment, the doped semiconductor layer 306 may be an n-type semiconductor while in other embodiments the doped semiconductor layer 306 may be a p-type semiconductor. In various embodiments, the doped semiconductor layer 306 may have a thickness in the range from about 100 µm to about 350 µm, e.g. in the range from about 100 µm to about 150 µm, e.g. in the range from about 150 µm to about 200 µm, e.g. in the range from about 200 µm to about 250 µm, e.g. in the range from about 250 µm to about 300 µm, e.g. in the range from about 300 µm to about 350 µm. According to various embodiments, the doped semiconductor layer 306 may have a thickness which may be any thickness desirable for a given application. In various embodiments, the doped semiconductor layer 306 may be square or substantially square in shape. The doped semiconductor layer 306 may be rectangular or substantially rectangular in shape. According to various embodiments, the doped semiconductor layer 306 may be a circle or substantially circular in shape. The doped semiconductor layer 306 may be an oval or substantially oval-like in shape. According to various embodiments, the doped semiconductor layer 306 may be a triangle or substantially triangular in shape. The doped semiconductor layer 306 may be a cross or substantially cross shaped. In various embodiments, doped semiconductor layer 306 may be completely coextensive in shape with the substrate 302. The doped semiconductor layer 306 may have a different shape than the substrate 302. According to various embodiments, the doped semiconductor layer 306 may be formed into any shape that may be desired for a given application.

According to various embodiments, as illustrated in FIGS. 3B and 3C, a Hall Effect sensor may include, several contact pads 310, a graphene layer 312, a structural fill layer 314, and a contact probe element 316. FIG. 3B differs from FIG. 3C primarily in that the epitaxy layer 304 of FIG. 3B in depicted as an n-type layer while the epitaxy layer 304 of FIG. 3C is depicted as p-type.

According to various embodiments, the contact pads 310 may be composed of and or may include various metals, e.g. copper, nickel, tin, lead, silver, gold, aluminum, titanium, gallium, indium, boron, and various alloys of these metals such as e.g. cupronickel, nickel-aluminum, aluminum-copper-silicon, etc. The contact pads 310 may include or be composed of various other materials, e.g. a metallic material, a metal foil, various semiconductor materials doped sufficiently to become substantially conductive, a solder wettable material, various metal alloys and/or compound metals, and various elemental metals as may be desirable for a given application.

In various embodiments, a Hall Effect pyramid may be formed from and/or coextensive with the graphene layer 312. In other words, a Hall Effect pyramid may be formed by structuring the graphene layer 312. The graphene layer 312 may be shaped into a hollow or substantially hollow pyramid-like shape and this hollow shape may be filled with a structural fill layer 314. According to various embodiments, the graphene layer 312 may be composed of and/or may include various metal chalcogenides like molybdenum disulfide, tungsten diselenide, vanadium diselenide, etc. In some embodiments, the graphene layer 312 may be composed of and/or may include elemental allotropes like silicene, germanane, germanene, or phosphorene, etc.

The structural fill layer 314 may be similar to the structural fill layer 216 described above and may be formed of similar materials and by similar processes.

According to various embodiments, the contact probe element 316 may be formed through the graphene layer 312 and coupled physically and/or electrically to the doped semiconductor layer 306. The contact probe element 316 may be composed of and or may include various metals, e.g. copper, nickel, tin, lead, silver, gold, aluminum, titanium, gallium, indium, boron, and various alloys of these metals such as e.g. cupronickel, nickel-aluminum, aluminum-copper-silicon, etc. The contact probe element 316 may include or be composed of various other materials, e.g. a metallic material, a metal foil, various semiconductor materials doped sufficiently to become substantially conductive, a solder wettable material, various metal alloys and/or compound metals, and various elemental metals as may be desirable for a given application.

According to various embodiments, the contact probe element 316 may be electrically coupled to a surface of the graphene layer 312. According to an embodiment the contact pads 310, the doped semiconductor layer 306, and the contact probe element 316 may be configured to allow the measurement of a voltage across the graphene layer 312. In various embodiments, the contact pads 310, the doped semiconductor layer 306, and the contact probe element 316 may be configured to allow for the measurement of a Hall Effect which may be present in the graphene layer 312.

According to various embodiments, as illustrated in FIG. 4, a Hall Effect sensor may include, a substrate 402, an epitaxy layer 404, a resist layer 406, a structural fill layer 408, several contact pads 410, and a graphene layer 412.

According to various embodiments, the substrate 402 may be similar to the substrate 202, discussed at length above. The substrate 402 may be composed of or may include similar materials as the substrate 202. The substrate 402 may have similar and/or substantially identical physical and electromagnetic characteristics and properties as the substrate 202. The substrate 402 may be formed or structured through the use of similar process as those used for or on the substrate 202.

According to various embodiments, the epitaxy layer 404 may be formed through and epitaxy process such as by molecular beam epitaxy or metal organic chemical vapor deposition. According to various embodiments, the epitaxy layer 404 may be similar to epitaxy layer 204, discussed at length above. The epitaxy layer 404 may be composed of or may include similar materials as the epitaxy layer 204. The epitaxy layer 404 may have similar and/or substantially identical physical and electromagnetic characteristics and properties as the epitaxy layer 204. The epitaxy layer 404 may be formed or structured through the use of similar process as those used for or on the epitaxy layer 204.

According to various embodiments, the resist layer 406 may be a polycrystalline silicon layer, in some embodiments the resist layer 406 may be a photoresist, e.g. various photopolymers, photo-resins, thermoplastics, and photoresists, e.g. various acrylates, methacrylates, photoinitiators, epoxide resins, negative photoresists, and positive photoresists. The resist layer 406 may at least partially cover the epitaxy layer 404. In various embodiments, the resist layer 406 may partially or completely encapsulate and/or enclose the contact pads 410.

According to various embodiments, the structural fill layer 408 may be deposited and/or formed over a portion of the resist layer 406. The structural fill layer 408 may at least partially encapsulate the graphene layer 412. The structural fill layer 408 may be similar to the structural fill layer 216, discussed at length above. The structural fill layer 408 may be composed of or may include similar materials as the structural fill layer 216. The structural fill layer 408 may have similar and/or substantially identical physical and electromagnetic characteristics and properties as the structural fill layer 216. The structural fill layer 408 may be formed or structured through the use of similar process as those used for or on structural fill layer 216.

According to various embodiments, the contact pads 410 may be similar to the contact pads 310, discussed at length above. The contact pads 410 may be composed of or may include similar materials and may be formed or structured through the use of similar process as those used for or on the contact pads 310.

According to various embodiments, the graphene layer 412 may be suspended across at least two of the contact pads 410. The graphene layer 412 may be in direct physical and/or electrical contact with the contact pads 410. The graphene layer 412 may be composed of and/or may include various metal chalcogenides like molybdenum disulfide, tungsten diselenide, vanadium diselenide, etc. In some embodiments, the graphene layer 412 may be composed of and/or may include elemental allotropes like silicene, germanane, germanene, or phosphorene, etc.

According to various embodiments a Hall Effect sensor similar to the sensor illustrated in FIG. 4, may be constructed and/or embodied by following the steps and elements illustrated in FIGS. 5A-5C. The Hall Effect sensor, as illustrated in FIGS. 5A-5C, may include a substrate 502, an epitaxy layer 504, a resist layer 506, several contact pads 508, a structural fill layer 510, a masking layer 512, a capping layer 514, a graphene layer 516, a first gap 518 below the graphene layer 516, and a second gap 520 above the graphene layer 516.

According to various embodiments, the substrate 502 may be similar to the substrate 202, discussed at length above. The substrate 502 may be composed of or may include similar materials as the substrate 202. The substrate 502 may have similar and/or substantially identical physical and electromagnetic characteristics and properties as the substrate 202. The substrate 502 may be formed or structured through the use of similar process as those used for or on the substrate 202.

According to various embodiments, the epitaxy layer 504 may be similar to epitaxy layer 204, discussed at length above. The epitaxy layer 504 may be composed of or may include similar materials as the epitaxy layer 204. The epitaxy layer 504 may have similar and/or substantially identical physical and electromagnetic characteristics and properties as the epitaxy layer 204. The epitaxy layer 504 may be formed or structured through the use of similar process as those used for or on the epitaxy layer 204.

According to various embodiments, the resist layer 506 may be composed of or may include similar materials as the resist layer 406. The resist layer 506 may have similar and/or substantially identical physical and electromagnetic characteristics and properties as the resist layer 406. The resist layer 506 may be formed or structured through the use of similar process as those used for or on the resist layer 406.

According to various embodiments, the several contact pads 508 may be similar to the contact pads 310, discussed at length above. The contact pads 508 may be composed of or may include similar materials and may be formed or structured through the use of similar process as those used for or on the contact pads 310.

According to various embodiments, the structural fill layer 510 may be deposited and/or formed over a portion of the resist layer 406. The structural fill layer 510 may at least partially encapsulate the graphene layer 516. The structural fill layer 510 may be similar to the structural fill layer 216, discussed at length above. The structural fill layer 510 may be composed of or may include similar materials and may be formed or structured through the use of similar process as those used for or on structural fill layer 216.

According to various embodiments, the masking layer 512 may be deposited and/or formed over the resist layer 506 and the structural fill layer 510. In some embodiments, a plurality of opening or perforations may be present in the masking layer 512. These perforations may expose portions of the structural fill layer 510, e.g. the perforations penetrate completely through a portion of the masking layer 512 which may be located over the structural fill layer 510. In some embodiments, the masking layer may be a semiconductor layer, such as a polysilicon layer or other elemental and/or compound semiconductors, e.g. a III-V compound semiconductor such as e.g. gallium arsenide or indium phosphide, or a II-VI compound semiconductor or a ternary compound semiconductor or a quaternary compound semiconductor, as may be desired for a given application.

According to an embodiment, the capping layer 514 may be formed over the masking layer 512. In some embodiment, the capping layer 514 may fill and or seal the perforation in the masking layer 512. The capping layer 514 may be composed of and/or may include a silicate glass such as borophosphosilicate glass or phosphosilicate glass; in some embodiments the capping layer 514 may be composed of or may include a thermoplastic such as high-density polyethylene; an ALD-dielectric such as an aluminum oxide; the capping layer 514 may be composed of or may include various other materials, e.g. hydrogen silsesquioxane, polyimide, polycarbonsilane, etc. In various embodiments, the capping layer 514 may be composed of or may include any material desirable for a give application.

According to various embodiments, the graphene layer 516 may be suspended across at least two of the contact pads 508. The graphene layer 516 may be in direct physical and/or electrical contact with the contact pads 508. The graphene layer 516 may be composed of and/or may include various metal chalcogenides like molybdenum disulfide, tungsten diselenide, vanadium diselenide, etc. In some embodiments, the graphene layer 516 may be composed of and/or may include elemental allotropes like silicene, germanane, germanene, or phosphorene, etc.

Figure 6A:
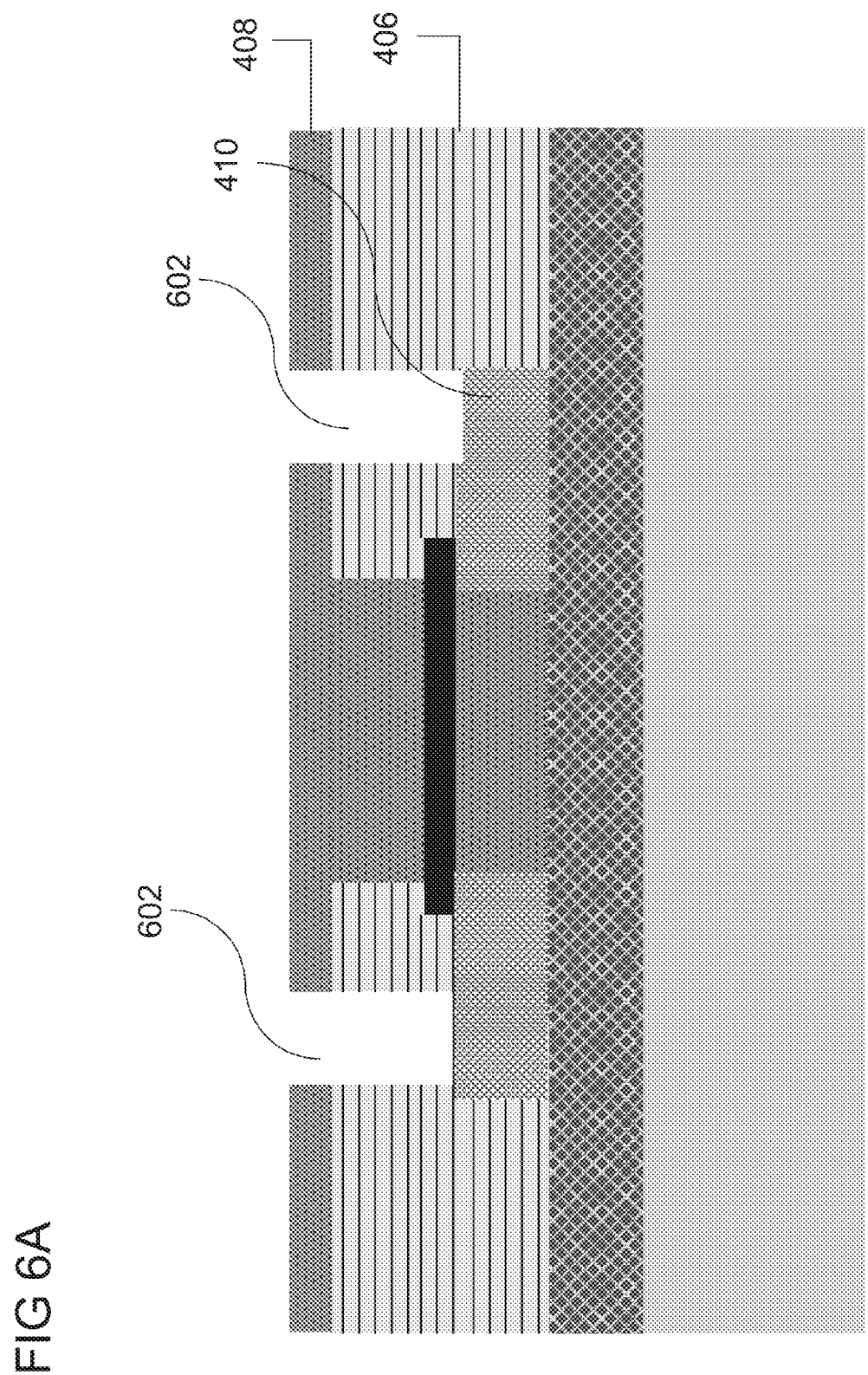
FIGS. 6A & 6B illustrate additional steps and/or features which may be implemented in the Hall sensor depicted in FIG. 4.
Figure 6B:
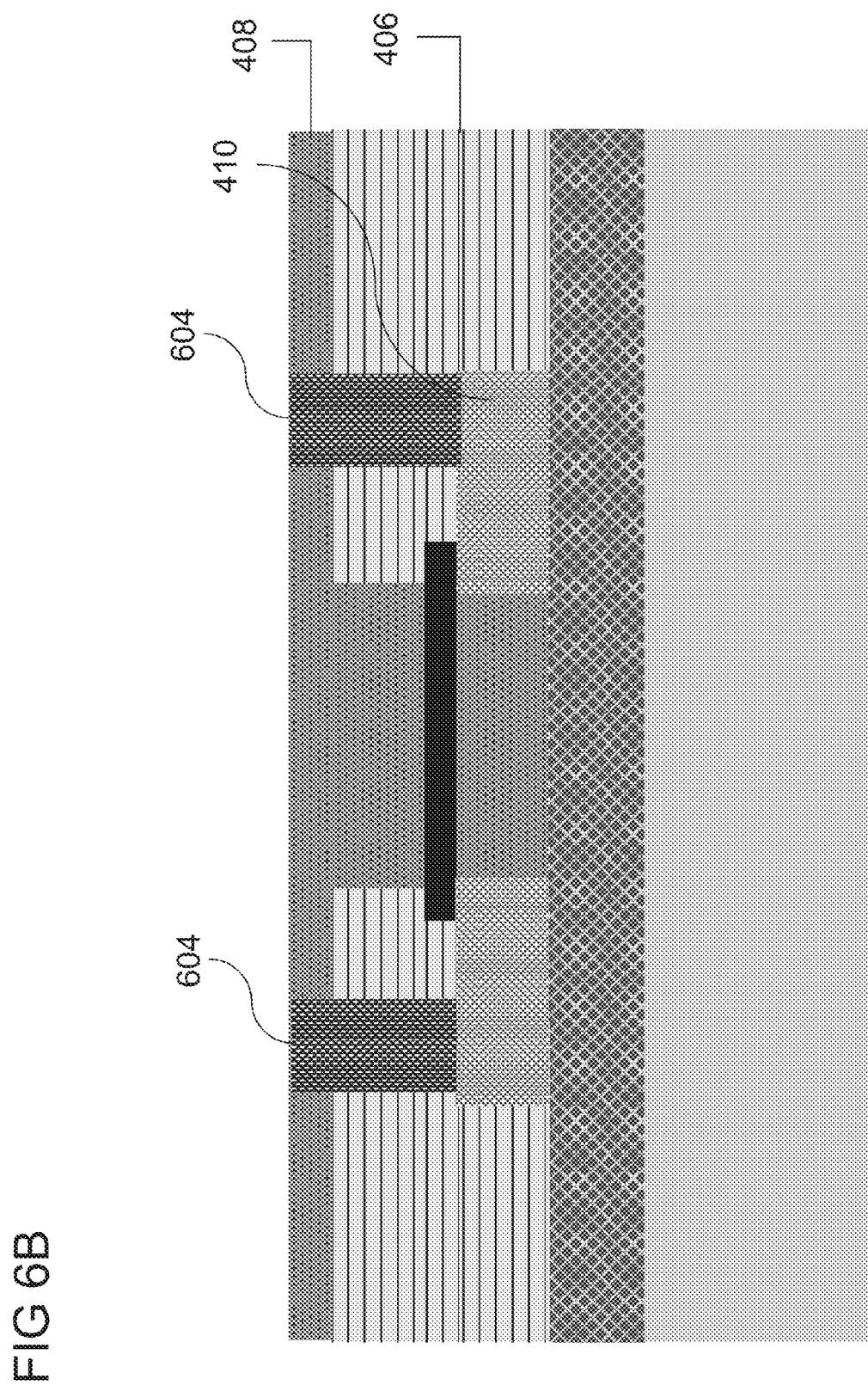

According to various embodiments, the Hall Effect sensor illustrated in FIGS. 6A & 6B may be similar to the sensor illustrated in FIG. 4, but may further include voids 602 and contact vias 604. The voids 602 may be formed through the structural fill layer 408 and the resist layer 406 by means of various techniques, e.g. isotropic gas phase etching, vapor etching, wet etching, isotropic dry etching, plasma etching, laser drilling, various grinding techniques, etc. The voids 602 may expose portions of the contact pads 410. In various embodiments, the contact vias 604 may be formed in the voids 602 through various techniques, e.g. vapor deposition, an electrochemical process, and electroplating process, an electroless process, a chemical vapor deposition process, molecular beam epitaxy, spin coating, a sputter deposition, and/or various other techniques as may be desirable for a given application. Further, the contact vias 604 may include or may be composed of various metals, e.g. copper, nickel, tin, lead, silver, gold, aluminum, titanium, gallium, indium, boron, and various alloys of these metals such as e.g. cupronickel, nickel-aluminum, aluminum-copper-silicon, etc. The contact vias 604 may include or be composed of various other materials, e.g. a metallic material, a metal foil, a solder wettable material, various metal alloys and/or compound metals, and various elemental metals as may be desirable for a given application. In various embodiments each of the contact vias 604 may be electrically and/or physically coupled to at least one contact pad 410.

Figure 7B:
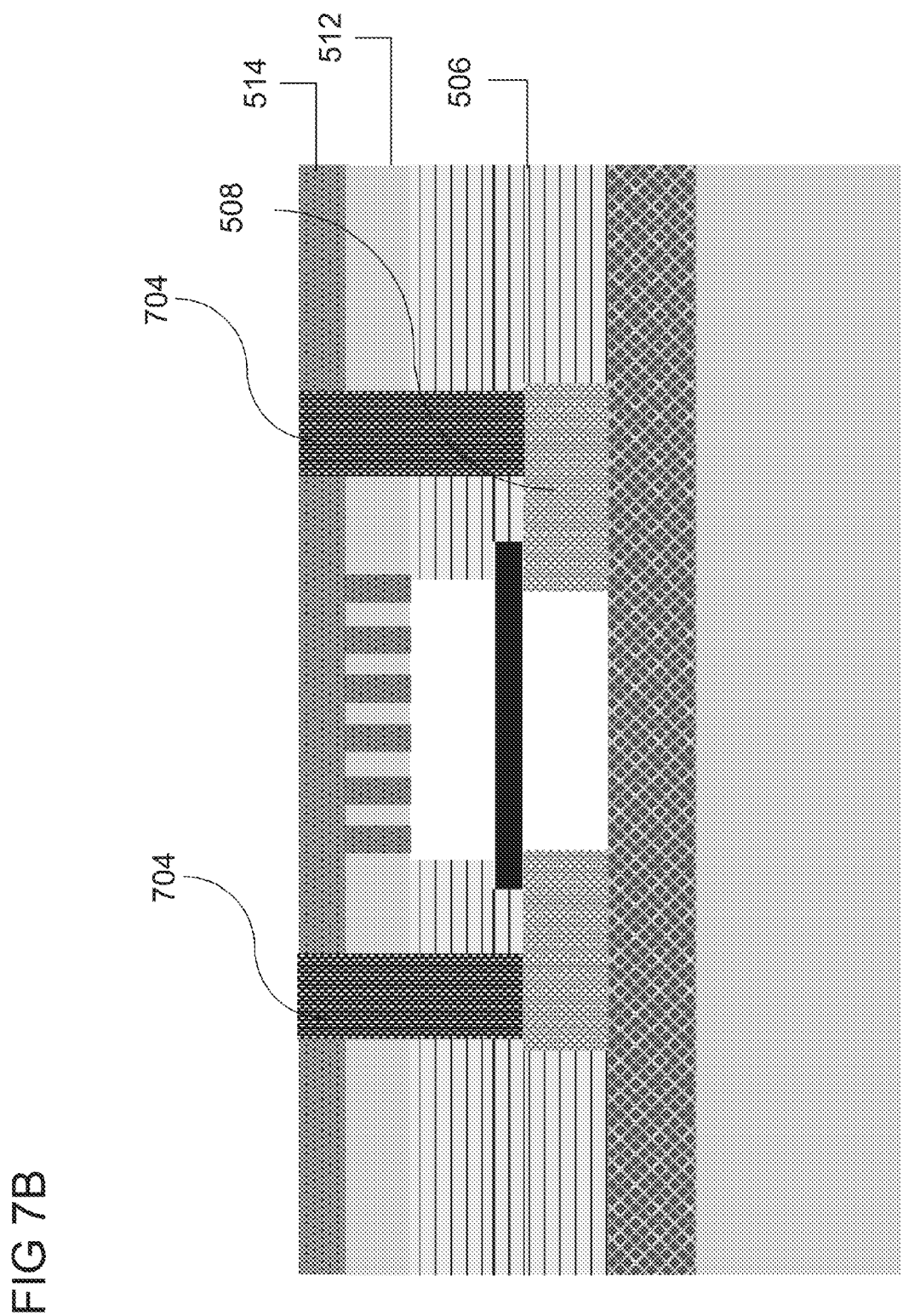
Figure 8A:
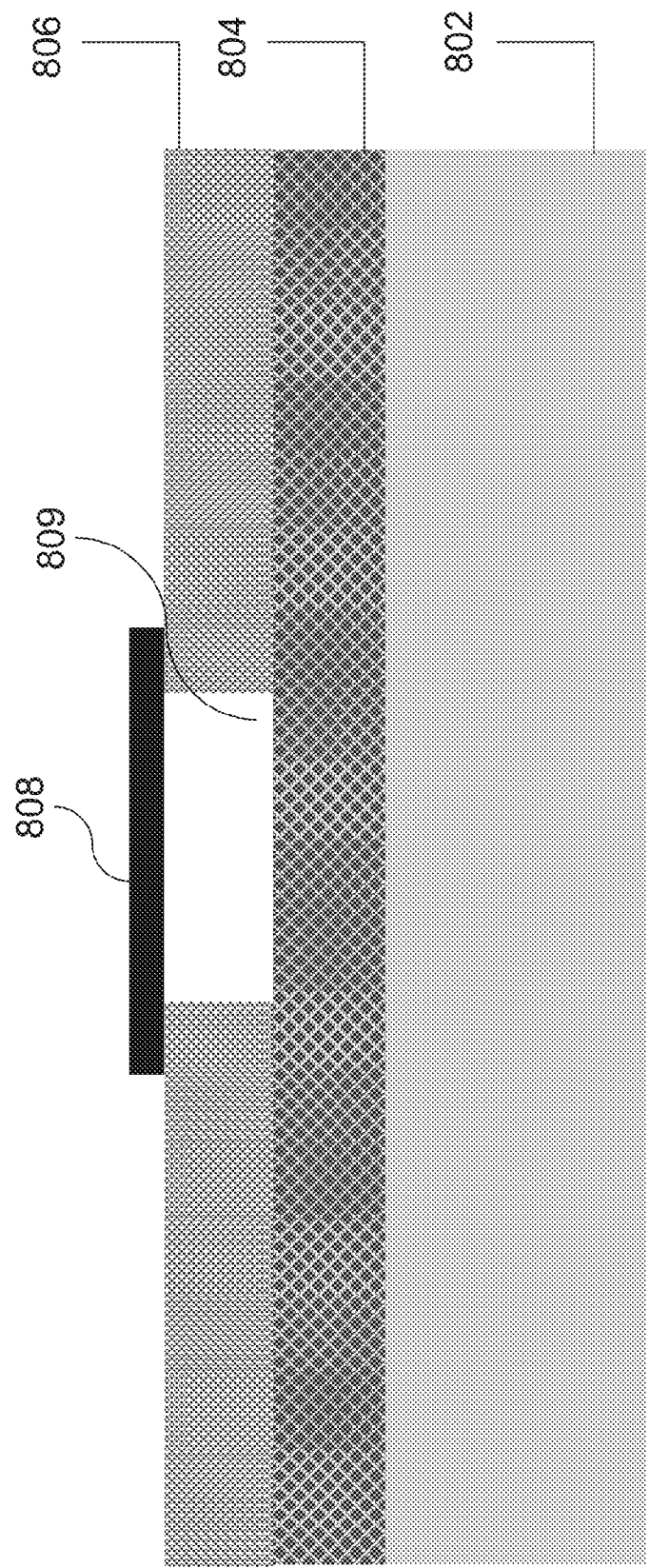
Figure 8B:
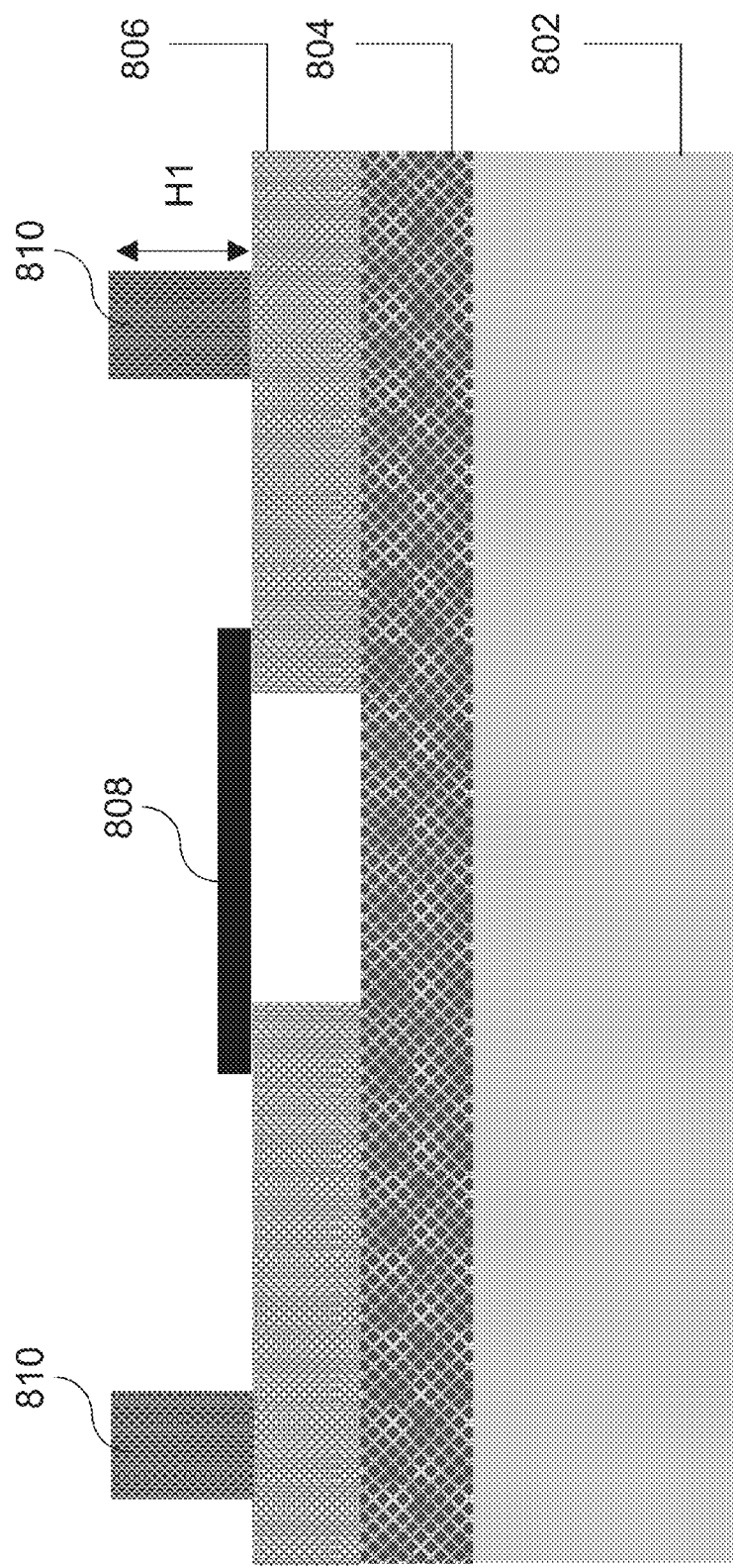

According to various embodiments, the Hall Effect sensor illustrated in FIGS. 7A & 7B may be similar to the sensor illustrated in FIGS. 5A-5C, but may further include voids 702 and contact vias 704. The voids 702 may be formed through the a resist layer 506, the masking layer 512, and the capping layer 514 by means of various techniques, e.g. isotropic gas phase etching, vapor etching, wet etching, isotropic dry etching, plasma etching, laser drilling, various grinding techniques, etc. The voids 702 may expose portions of the contact pads 508. In various embodiments, the contact vias 704 may be formed in the voids 702 through various techniques, e.g. vapor deposition, an electrochemical process, and electroplating process, an electroless process, a chemical vapor deposition process, molecular beam epitaxy, spin coating, a sputter deposition, and/or various other techniques as may be desirable for a given application. Further, the contact vias 704 may include or may be composed of various metals, e.g. copper, nickel, tin, lead, silver, gold, aluminum, titanium, gallium, indium, boron, and various alloys of these metals such as e.g. cupronickel, nickel-aluminum, aluminum-copper-silicon, etc. The contact vias 704 may include or be composed of various other materials, e.g. a metallic material, a metal foil, a solder wettable material, various metal alloys and/or compound metals, and various elemental metals as may be desirable for a given application. In various embodiments each of the contact vias 704 may be electrically and/or physically coupled to at least one contact pad 508.

According to various embodiments a Hall Effect sensor similar to the sensors described above, may be constructed and/or embodied by following the steps and elements as illustrated in FIGS. 8A-8D. The Hall Effect sensor, as illustrated in FIGS. 8A-8D, may include a substrate 802, an epitaxy layer 804, a metal layer 806, a graphene layer 808, and a gap 809 in the metal layer 806. The substrate 802 may be similar to the substrate 202, discussed at length above. The substrate 502 may be composed of or may include similar materials and may be formed or structured through the use of similar process as those used for or on the substrate 202. The epitaxy layer 804 may be similar to epitaxy layer 204, discussed at length above. The epitaxy layer 804 may be composed of or may include similar materials and may be formed or structured through the use of similar process as those used for or on the epitaxy layer 204. The metal layer 806 may be similar to metal layer 208, discussed at length above. The metal layer 806 may be composed of or may include similar materials and may be formed or structured through the use of similar process as those used for or on metal layer 208. In various embodiments, the graphene layer 808 may be suspended across the gap 809 in the metal layer 806. The graphene layer 808 may be composed of and/or may include various metal chalcogenides like molybdenum disulfide, tungsten diselenide, vanadium diselenide, etc. In some embodiments, the graphene layer 808 may be composed of and/or may include elemental allotropes like silicene, germanane, germanene, or phosphorene, etc.

In some embodiments, the Hall Effect sensor, as illustrated in FIGS. 8A-8D, may further include a ring structure 810 (shown in cross-section) formed on a surface of the metal layer 806. In various embodiments, the Hall Effect sensor, as illustrated in FIGS. 8A-8D, may further include a capping structure 812 formed on the ring structure 810, and contact vias 814 formed in the capping structure 812. In some embodiments the metal layer 806, the ring structure 810, and the capping structure 812 may enclose a cavity 816.

According to various embodiments, the ring structure 810 may have a height, H1, which may be in the range from about 200 µm to about 2000 µm, e.g. in the range from about 200 µm to about 450 µm, e.g. in the range from about 450 µm to about 800 µm, e.g. in the range from about 800 µm to about 1000 µm, e.g. in the range from about 1000 µm to about 1200 µm, e.g. in the range from about 1200 µm to about 1450 µm. According to various embodiments, the ring structure 810 may have a thickness which may be any thickness desirable for a given application. In some embodiments, the ring structure may be implemented as a photoresist, e.g. SU-8, various polyimide compounds, various photopolymers, photo-resins, thermoplastics, and photoresists, e.g. various acrylates, methacrylates, photoinitiators, epoxy resins, negative photoresists, and positive photoresists.

In various embodiments, the capping structure 812 may be formed over and/or suspended across the ring structure 810. The capping structure 812 may be structured such that the graphene layer 808 may be enclosed in the cavity 816. In some embodiments, the capping structure 812 may be formed from the same material as the ring structure 810, while in other embodiments the ring structure 810 and the capping structure 812 may be formed from different materials.

In various embodiments, the contact vias 814 may be formed through and/or in the capping structure 812. In various embodiments, the contact vias 814 may be formed through and/or in the ring structure 810. In some embodiments, the contact vias may be contained by or be formed through both the ring structure 810 and the capping structure 812. The contact vias 814 may be similar to contact vias 704, discussed at length above. The contact vias 814 may be composed of or may include similar materials and may be formed or structured through the use of similar process as those used for or on the contact vias 704. In at least one embodiment, the contact vias 814 may be electrically coupled to the metal layer 806.

According to various embodiments a Hall Effect sensor similar to the sensors described above, may be constructed and/or embodied by following the steps and elements as illustrated in FIGS. 9A & 9B. The Hall Effect sensor depicted in FIGS. 9A & 9B may include a substrate 902, an epitaxy layer 904, several contact pads 906, a recess 908 in the epitaxy layer 904, and a graphene layer 910. The Hall Effect sensor depicted in FIGS. 9A & 9B may be implemented as a so-called "3-D" Hall Effect sensor.

In various embodiments, the recess 908 may be formed in the epitaxy layer 904 by means of various techniques, e.g. isotropic gas phase etching, vapor etching, wet etching, isotropic dry etching, plasma etching, laser drilling, various grinding techniques, etc. The graphene layer 910 may be formed over a surface of the recess 908. In other various embodiments, the graphene layer may 910 be implemented as a type of lining or coating on a surface of the recess 908. In various embodiments, the recess 908 may be implemented as a pyramid or be substantially pyramidal in shape. In various embodiments the recess 908 may be a truncated pyramid and/or a square frustum-like shape. According to an embodiment, the recess 908 may be any shape desired for a given application.

The substrate 902 may be similar to the substrate 202, discussed at length above. The substrate 902 may be composed of or may include similar materials and may be formed or structured through the use of similar process as those used for or on the substrate 202. The epitaxy layer 904 may be similar to epitaxy layer 204, discussed at length above. The epitaxy layer 904 may be composed of or may include similar materials and may be formed or structured through the use of similar process as those used for or on the epitaxy layer 204. The contact pads 906 may be similar to the contact pads 310, discussed at length above. The contact pads 906 may be composed of or may include similar materials and may be formed or structured through the use of similar process as those used for or on the contact pads 310. The graphene layer 910 may be composed of and/or may include various metal chalcogenides like molybdenum disulfide, tungsten diselenide, vanadium diselenide, etc. In some embodiments, the graphene layer 910 may be composed of and/or may include elemental allotropes like silicene, germanane, germanene, or phosphorene, etc.

Figure 10A:
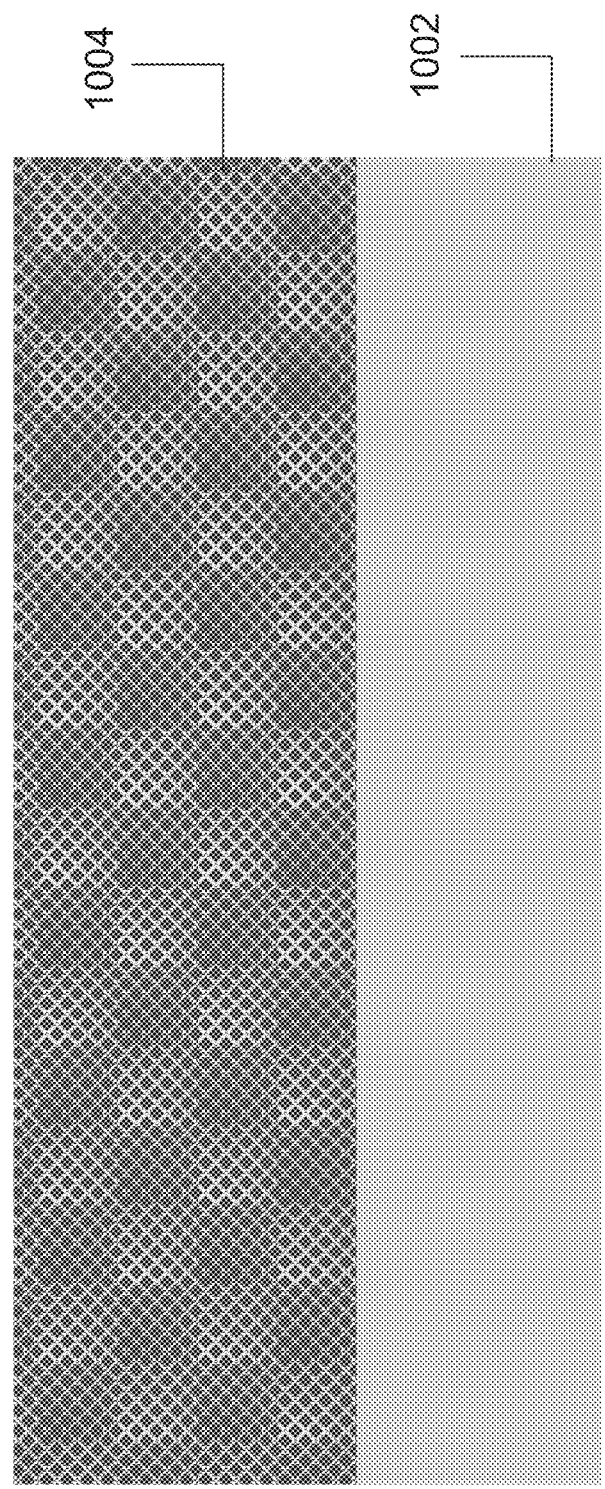
FIGS. 10A through 10C depict, in accordance with an embodiment, a perspective progression of a method of forming a 3-D Hall Effect Sensor as well as perspective embodiments of a 3-D Hall Effect sensor.
Figure 10B:
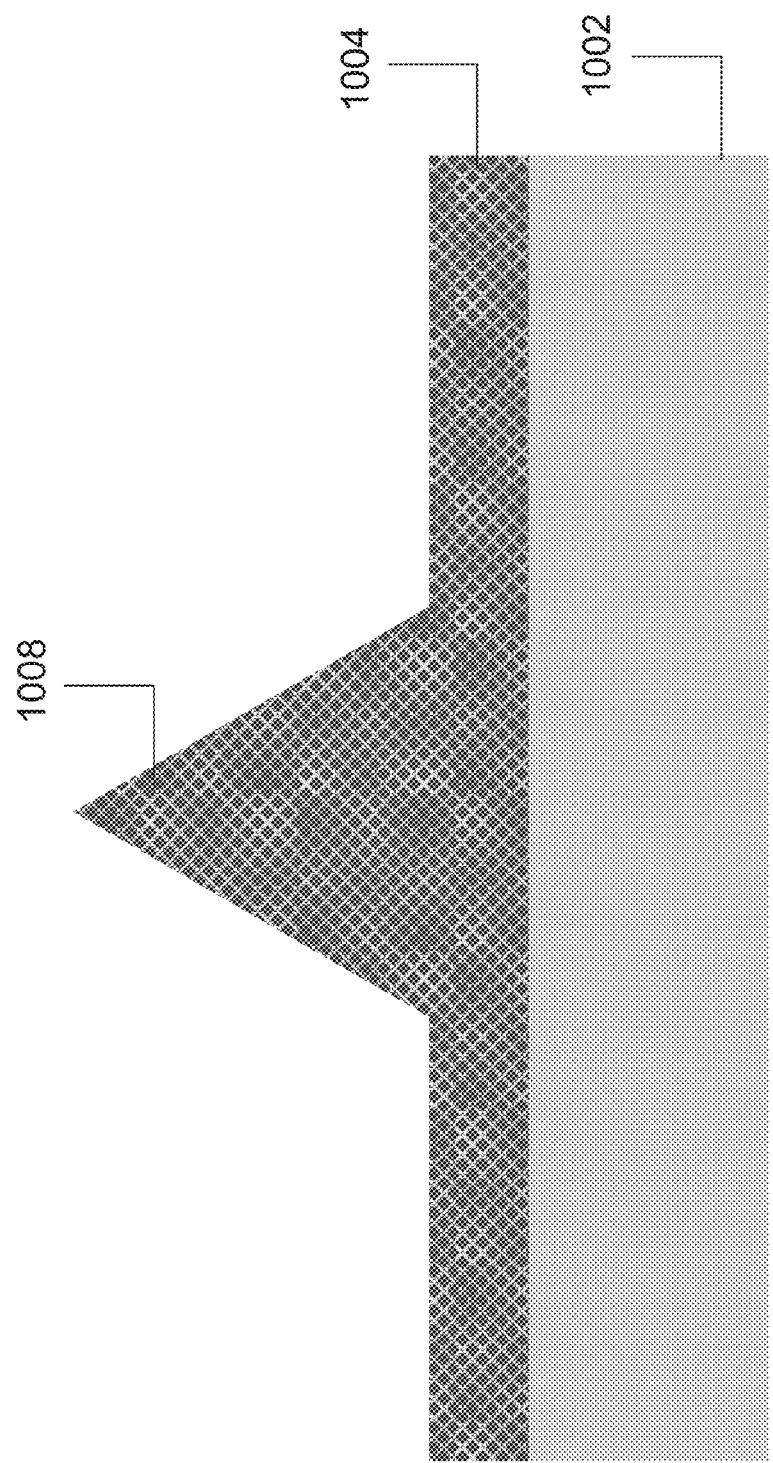
Figure 10C:
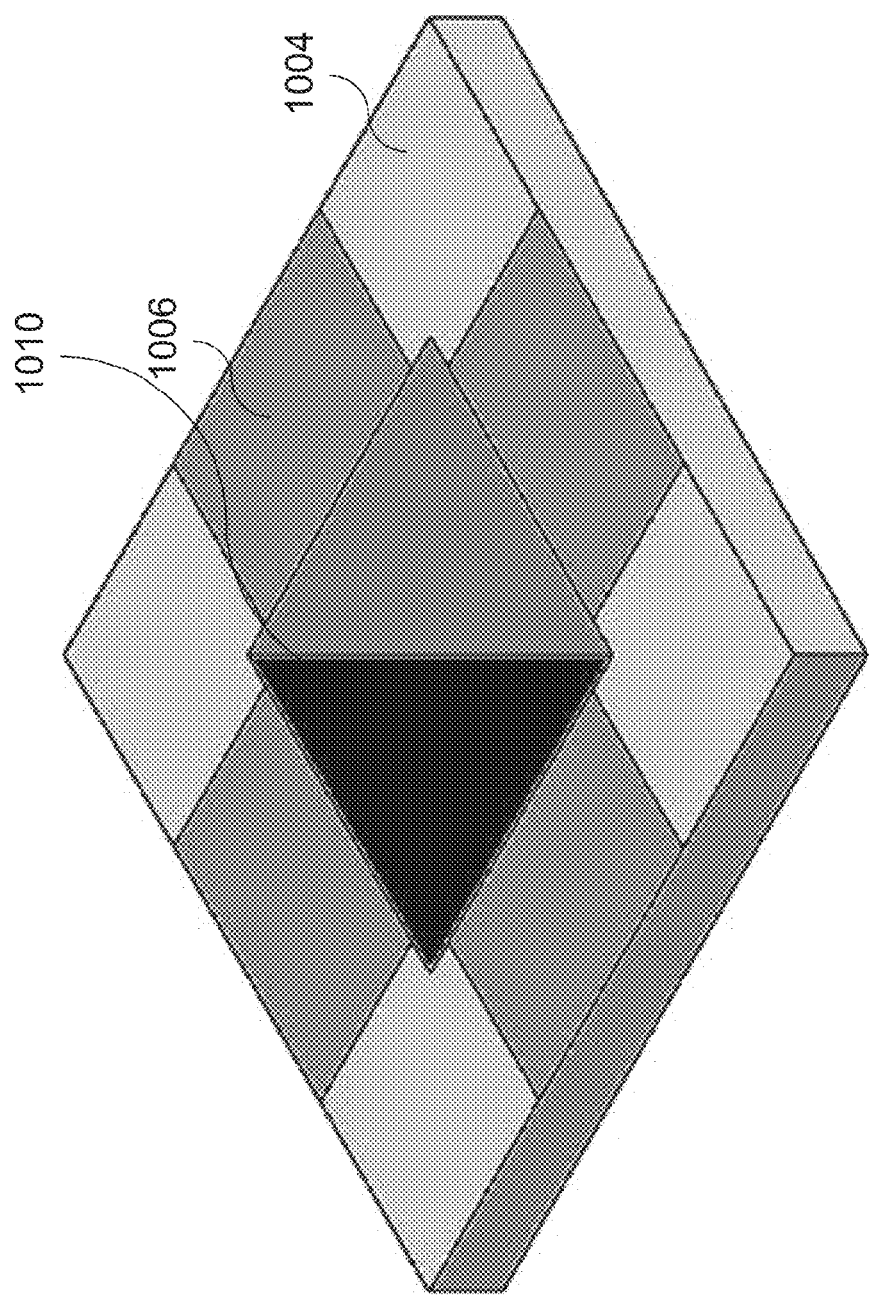

According to various embodiments a Hall Effect sensor similar to the sensors described above, may be constructed and/or embodied by following the steps and elements as illustrated in FIGS. 10A-10C. The Hall Effect sensor depicted in FIGS. FIGS. 10A-10C may be implemented as a so-called "3-D" Hall Effect sensor and may include a substrate 1002, an epitaxy layer 1004, several contact pads 1006 formed on a surface of the epitaxy layer 1004, a protrusion 1008 from the epitaxy layer 1004, and a graphene layer 1010.

In various embodiments, the protrusion 1008 may be formed by structuring the epitaxy layer 1004 by means of various techniques, e.g. isotropic gas phase etching, vapor etching, wet etching, isotropic dry etching, plasma etching, laser drilling, various grinding techniques, etc. The graphene layer 1010 may be formed over a surface of the protrusion 1008. In other various embodiments, the graphene layer 1010 may be implemented as a type of lining or coating on a surface of the protrusion 1008. In various embodiments, the protrusion 1008 may be implemented as a pyramid or be substantially pyramidal in shape. According to an embodiment, the protrusion 1008 may be any shape desired for a given application.

The substrate 1002 may be similar to the substrate 202, discussed at length above. The substrate 1002 may be composed of or may include similar materials and may be formed or structured through the use of similar process as those used for or on the substrate 202. The epitaxy layer 1004 may be similar to epitaxy layer 204, discussed at length above. The epitaxy layer 1004 may be composed of or may include similar materials and may be formed or structured through the use of similar process as those used for or on the epitaxy layer 204. The contact pads 1006 may be similar to the contact pads 310, discussed at length above. The contact pads 1006 may be composed of or may include similar materials and may be formed or structured through the use of similar process as those used for or on the contact pads 310. The graphene layer 1010 may be composed of and/or may include various metal chalcogenides like molybdenum disulfide, tungsten diselenide, vanadium diselenide, etc. In some embodiments, the graphene layer 1010 may be composed of and/or may include elemental allotropes like silicene, germanane, germanene, or phosphorene, etc.

Figure 11A:
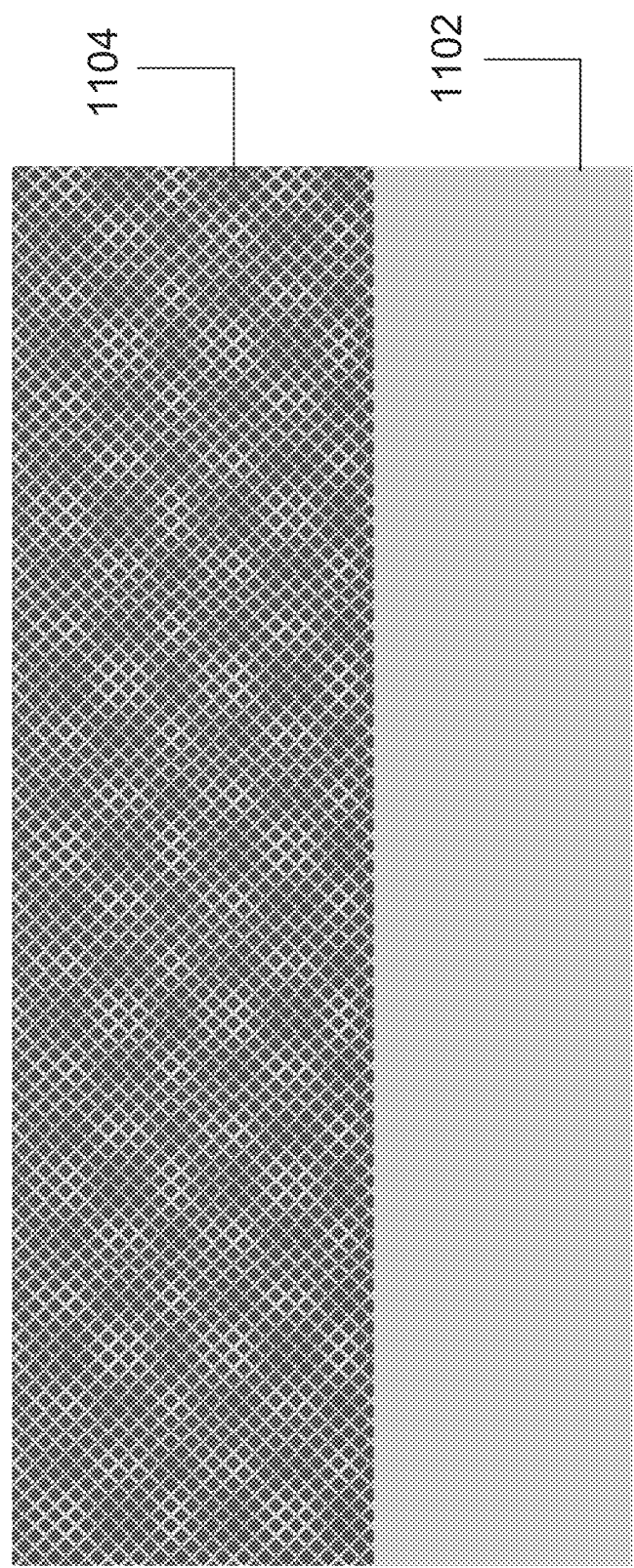
FIGS. 11A through 11C depict, in accordance with an embodiment, a perspective progression of a method of forming a 3-D Hall Effect Sensor as well as perspective embodiments of a 3-D Hall Effect sensor.
Figure 11B:
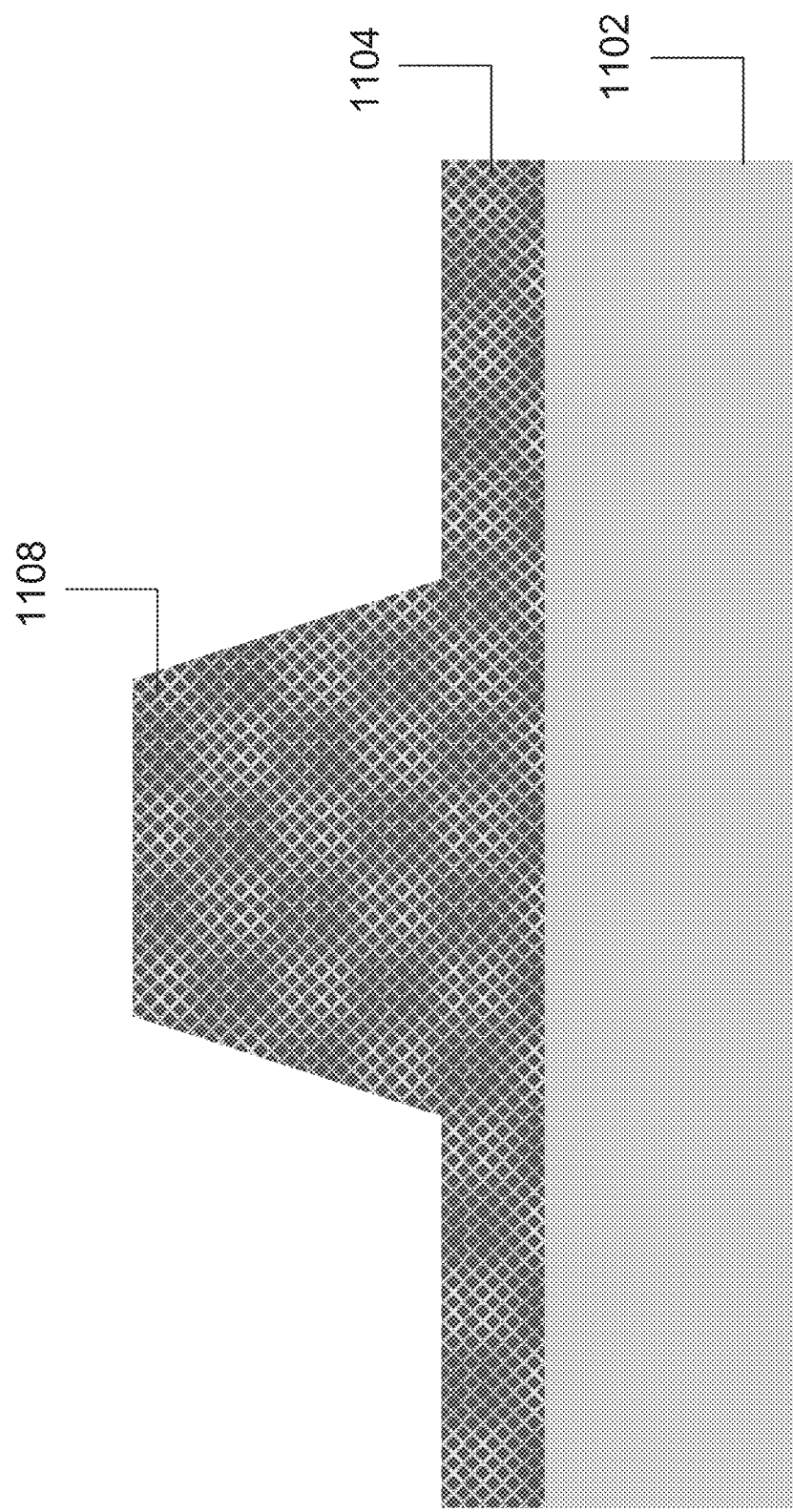
Figure 11C:
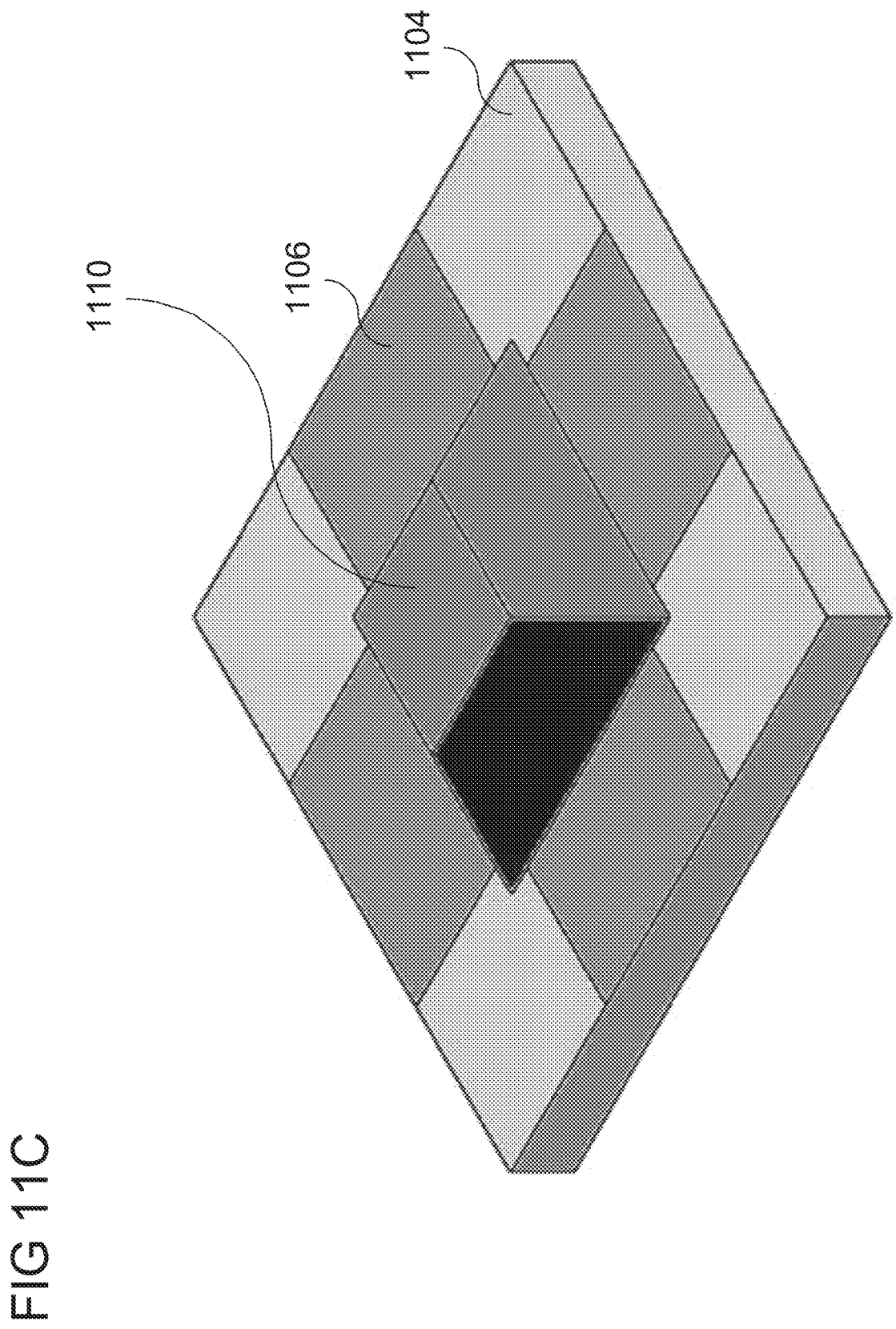

According to various embodiments a Hall Effect sensor similar to the sensors described above, may be constructed and/or embodied by following the steps and elements as illustrated in FIGS. 11A-11C. The Hall Effect sensor depicted in FIGS. FIGS. 11A-11C may be implemented as a so-called "3-D" Hall Effect sensor and may include a substrate 1102, an epitaxy layer 1104, several contact pads 1106 formed on a surface of the epitaxy layer 1104, a protrusion 1108 from the epitaxy layer 1104, and a graphene layer 1110.

In various embodiments, the protrusion 1108 may be formed by structuring the epitaxy layer 1104 by means of various techniques, e.g. isotropic gas phase etching, vapor etching, wet etching, isotropic dry etching, plasma etching, laser drilling, various grinding techniques, etc. The graphene layer 1110 may be formed over a surface of the protrusion 1108. In other various embodiments, the graphene layer 1110 may be implemented as a type of lining or coating on a surface of the protrusion 1108. In various embodiments, the protrusion 1108 may be implemented as a pyramid or be substantially pyramidal in shape. According to an embodiment, the protrusion 1108 may be any shape desired for a given application.

The substrate 1102 may be similar to the substrate 202, discussed at length above. The substrate 1102 may be composed of or may include similar materials and may be formed or structured through the use of similar process as those used for or on the substrate 202. The epitaxy layer 1104 may be similar to epitaxy layer 204, discussed at length above. The epitaxy layer 1104 may be composed of or may include similar materials and may be formed or structured through the use of similar process as those used for or on the epitaxy layer 204. The contact pads 1106 may be similar to the contact pads 310, discussed at length above. The contact pads 1106 may be composed of or may include similar materials and may be formed or structured through the use of similar process as those used for or on the contact pads 310. The graphene layer 1110 may be composed of and/or may include various metal chalcogenides like molybdenum disulfide, tungsten diselenide, vanadium diselenide, etc. In some embodiments, the graphene layer 1110 may be composed of and/or may include elemental allotropes like silicene, germanane, germanene, or phosphorene, etc.

The following examples pertain to further embodiments.

In Example 1, a structure, which may include a substrate having a first side; a seed layer formed on said first side; and a graphene layer formed over at least a part of the seed layer; where at least a portion of the seed layer between the substrate and said graphene layer may be removed to form a suspended graphene structure from said graphene layer.

In Example 2, the structure of Example 1 may further include a support structure formed over a portion of the graphene layer; an encapsulation structure formed over a portion of the support structure; where the encapsulation structure, the support structure, and the graphene layer may enclose a volume.

In Example 3, the structure of any of the preceding Examples, where the volume may be capable of sustaining a low-pressure environment.

In Example 4, the structure of any of the preceding Examples, where the encapsulation structure completely fills said volume.

In Example 5, the structure of any of the preceding Examples, where said encapsulation layer may be implemented as borophosphosilicate glass.

In Example 6, the structure of any of the preceding Examples, where said encapsulation layer may be a high-density polyethylene.

In Example 7, a method for producing a hall sensor, including providing a substrate having a first side; forming a seed layer on said first side; forming a graphene layer over at least a part of the seed layer; and removing a portion of the seed layer between the substrate and said graphene layer.

In Example 8, the method of Example 7 may further include patterning the graphene layer.

In Example 9, the method of Examples 7 or 8 where said portion of the seed layer is removed by etching.

In Example 10, the method of Examples 7-9, where the portion of the seed layer which is not removed by etching may form at least one contact pad.

In Example 11, the method of Examples 7-10, may further include forming a three-dimensional recess in said first side.

In Example 12, the method of Examples 7-11, where the three-dimensional recess is formed prior to said seed layer being formed.

In Example 13, the method of Examples 7-12, where the three-dimensional recess is formed on the (1,1,1) lattice plane.

In Example 14, the method of Examples 7-13, where the three-dimensional recess is substantially pyramid shaped.

In Example 15, the method of Examples 7-14, where the three-dimensional recess is substantially octagon shaped.

In Example 16, the method of Examples 7-15, where the three-dimensional recess is substantially cube shaped.

In Example 17, the method of Examples 7-16, where the three-dimensional recess is substantially quatrefoil shaped.

In Example 18, the method of Examples 7-17, where the seed layer may be a metal layer.

In Example 19, the method of Examples 7-18, where the metal layer may be copper.

In Example 20, the method of Examples 7-19, where the metal layer may be nickel.

In Example 21, the method of Examples 7-20, where the metal layer may be a copper-nickel alloy.

In Example 22, the method of Examples 7-21 may further include forming an encapsulation layer over or around at least a portion of the graphene layer.

In Example 23, the method of Examples 7-22, where said encapsulation layer may be borophosphosilicate glass.

In Example 24, the method of Examples 7-23, where said encapsulation layer may be high-density polyethylene.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A structure, comprising:
   a substrate having a first side;
   an epitaxy layer formed on said first side;
   a three-dimensional recess formed in the epitaxy layer;
   a seed layer formed on said first side;
   a graphene layer formed over at least a part of the seed layer;
      wherein at least a portion of the seed layer between the substrate and said graphene layer is removed without separating the substrate to form a suspended graphene structure from said graphene layer,
   a support structure formed over a portion of the graphene layer; and
   an encapsulation structure formed over a portion of the support structure;
      wherein the encapsulation structure, the support structure, and the graphene layer encloses a volume.

2. The structure of claim 1, wherein the volume is capable of sustaining a low-pressure environment.

3. The structure of claim 1, wherein the encapsulation structure completely fills said volume.

4. The structure of claim 1, said encapsulation layer comprises borophosphosilicate glass.

5. The structure of claim 1, wherein said encapsulation layer comprises high-density polyethylene.

6. A method for producing a hall sensor, comprising:
   providing a substrate having a first side;
   forming an epitaxy layer on said first side;
   forming a three-dimensional recess in the epitaxy layer;
   forming a seed layer on said first side after forming the three-dimensional recess;
   forming a graphene layer over at least a part of the seed layer without contacting the substrate; and
   removing a portion of the seed layer between the substrate and said graphene layer.

7. The method of claim 6 further comprising patterning the graphene layer.

8. The method of claim 6 wherein said portion of the seed layer is removed by etching.

9. The method of claim 8 wherein the portion of the seed layer which is not removed by etching forms at least one contact pad.

10. The method of claim 6 wherein the three-dimensional recess is formed on the (1,1,1) lattice plane.

11. The method of claim 6 wherein the three-dimensional recess is substantially pyramid shaped.

12. The method of claim 6 wherein the three-dimensional recess is substantially octagon shaped.

13. The method of claim 6 wherein the three-dimensional recess is substantially cube shaped.

14. The method of claim 6 wherein the three-dimensional recess is substantially quatrefoil shaped.

15. The method of claim 6 wherein the seed layer comprises a metal layer.

16. The method of claim 15 wherein the metal layer comprises copper.

17. The method of claim 15 wherein the metal layer comprises nickel.

18. The method of claim 15 wherein the metal layer comprises a copper-nickel alloy.

19. The method of claim 6 further comprising:
   forming an encapsulation layer over or around at least a portion of the graphene layer.

20. The method of claim 19 wherein said encapsulation layer comprises borophosphosilicate glass.

21. The method of claim 19 wherein said encapsulation layer comprises high-density polyethylene.

22. A hall sensor, comprising:
   a substrate having a first side;
   a seed layer formed on said first side, the seed layer comprising at least a first portion, a second portion and a third portion, each of the first, second and third portions of the seed layer being separated from respective other portions of the seed layer; and
   a graphene layer formed above the first, second and third portions of the seed layer and in contact with the first, second and third portions of the seed layer;
   wherein a further portion of the seed layer is removed between the substrate and said graphene layer to form a suspended graphene structure.

23. The hall sensor of claim 22, wherein at least one wire is connected to each portion of the seed layer.

24. The hall sensor of claim 22, wherein a stress-reducing mounting structure is arranged between the graphene layer and at least one of the portions of the seed layer.

* * * * *